US009659911B1

(12) United States Patent
Chang et al.

(10) Patent No.: US 9,659,911 B1
(45) Date of Patent: May 23, 2017

(54) PACKAGE STRUCTURE AND MANUFACTURING METHOD THEREOF

(71) Applicant: Powertech Technology Inc., Hsinchu County (TW)

(72) Inventors: Chia-Wei Chang, Hsinchu County (TW); Li-Chih Fang, Hsinchu County (TW); Kuo-Ting Lin, Hsinchu County (TW); Yong-Cheng Chuang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/264,606

(22) Filed: Sep. 14, 2016

Related U.S. Application Data

(60) Provisional application No. 62/324,899, filed on Apr. 20, 2016.

(51) Int. Cl.
  *H01L 25/065* (2006.01)
  *H01L 23/00* (2006.01)
  *H01L 23/31* (2006.01)
  *H01L 25/18* (2006.01)
  *H01L 25/00* (2006.01)
  *H01L 21/56* (2006.01)

(52) U.S. Cl.
  CPC ........ *H01L 25/0657* (2013.01); *H01L 21/563* (2013.01); *H01L 23/3192* (2013.01); *H01L 25/18* (2013.01); *H01L 25/50* (2013.01); *H01L 2225/0651* (2013.01); *H01L 2225/06517* (2013.01); *H01L 2225/06548* (2013.01); *H01L 2225/06562* (2013.01); *H01L 2225/06586* (2013.01)

(58) Field of Classification Search
  CPC combination set(s) only.
  See application file for complete search history.

(56) References Cited

U.S. PATENT DOCUMENTS

| 9,129,971 B2* | 9/2015 | Camacho | H01L 21/6835 |
| 2008/0272477 A1* | 11/2008 | Do | H01L 21/76898 |
| | | | 257/686 |
| 2015/0262968 A1 | 9/2015 | Aleksov et al. | |
| 2015/0380392 A1* | 12/2015 | Pang | H01L 21/56 |
| | | | 257/777 |
| 2016/0013146 A1* | 1/2016 | Chen | H01L 24/19 |
| | | | 257/738 |

* cited by examiner

*Primary Examiner* — Mamadou Diallo
(74) *Attorney, Agent, or Firm* — Jianq Chyun IP Office

(57) ABSTRACT

A package structure and a manufacturing method thereof are provided. The package structure includes a redistribution layer (RDL), at least one first die, a plurality of conductive terminals and solder balls, a first encapsulant, a plurality of second dies, and a second encapsulant. The RDL has a first surface and a second surface opposite to the first surface. The first die and the conductive terminals are electrically connected to the RDL and are located on the first surface of the RDL. The first encapsulant encapsulates the first die and the conductive terminals. The first encapsulant exposes part of the conductive terminals. The solder balls are electrically connected to the conductive terminals and are located over the conductive terminals exposed by the first encapsulant. The second dies are electrically connected to the RDL and are located on the second surface of the RDL. The second encapsulant encapsulates the second dies.

20 Claims, 29 Drawing Sheets

PACKAGE STRUCTURE AND MANUFACTURING METHOD THEREOF

CROSS REFERENCE TO RELATED APPLICATION

This application claims the priority benefit of U.S. provisional application Ser. No. 62/324,899, filed on Apr. 20, 2016. The entirety of the above-mentioned patent application is hereby incorporated by reference herein and made a part of specification.

BACKGROUND OF THE INVENTION

Field of Invention

The present invention relates to a package structure and a manufacturing method thereof, and more particularly, to a package structure having dies on both sides of a redistribution layer (RDL).

Description of Related Art

In order for electronic product design to achieve being light, slim, short, and small, semiconductor packaging technology has kept progressing, in attempt to develop products that are smaller in volume, lighter in weight, higher in integration, and more competitive in market. For example, in order to achieve a thinner electronic product, it is favorable to provide a high density packaging structure with a smaller thickness. As such, miniaturizing the package structure while maintaining the number of chips encapsulated in the package has become a challenge to researchers in the field.

SUMMARY OF THE INVENTION

The invention provides a package structure and a manufacturing method thereof, which effectively reduces the size thereof.

The invention provides a package structure including a redistribution layer (RDL), at least one first die, a plurality of conductive terminals, a first encapsulant, a plurality of solder balls, a plurality of second dies, and a second encapsulant. The RDL has a first surface and a second surface opposite to the first surface. The first die and the conductive terminals are electrically connected to the RDL and are located on the first surface of the RDL. The first encapsulant encapsulates the first die and the conductive terminals. The first encapsulant exposes at least part of the conductive terminals. The solder balls are electrically connected to the conductive terminals and are located over the conductive terminals exposed by the first encapsulant. The second dies are electrically connected to the RDL and are located on the second surface of the RDL. The second encapsulant encapsulates the second dies.

The invention provides a manufacturing method of a package structure. The method includes the following steps. A redistribution layer (RDL) is formed over a carrier. The RDL has a first surface and a second surface opposite to the first surface, and the second surface of the RDL faces the carrier. A plurality of conductive terminals and at least one first die are formed on the first surface of the RDL. The first die and the conductive terminals are encapsulated by a first encapsulant, and the first encapsulant exposes at least part of the conductive terminals. The second surface of the RDL is separated from the carrier. A plurality of second dies are formed on the second surface of the RDL. The second dies are encapsulated by a second encapsulant. A plurality of solder balls are formed over the conductive terminals exposed by the first encapsulant.

Based on the above, the dies are formed on both sides of the RDL in the package structure of the invention. Therefore, a substrate having a large thickness may be eliminated in the package structure of the invention. Moreover, since at least one die is located on a surface opposite to the rest of the dies in a flip-chip manner, the at least one die may be grinded to any thickness. Furthermore, the at least one die may be coplanar with the conductive terminals. As a result, a thickness of the package structure may be reduced, thereby achieving miniaturization in the package structure.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2K are schematic cross-sectional views illustrating a manufacturing method of a package structure according to an embodiment of the invention.

DESCRIPTION OF EMBODIMENTS

Figure 1A:
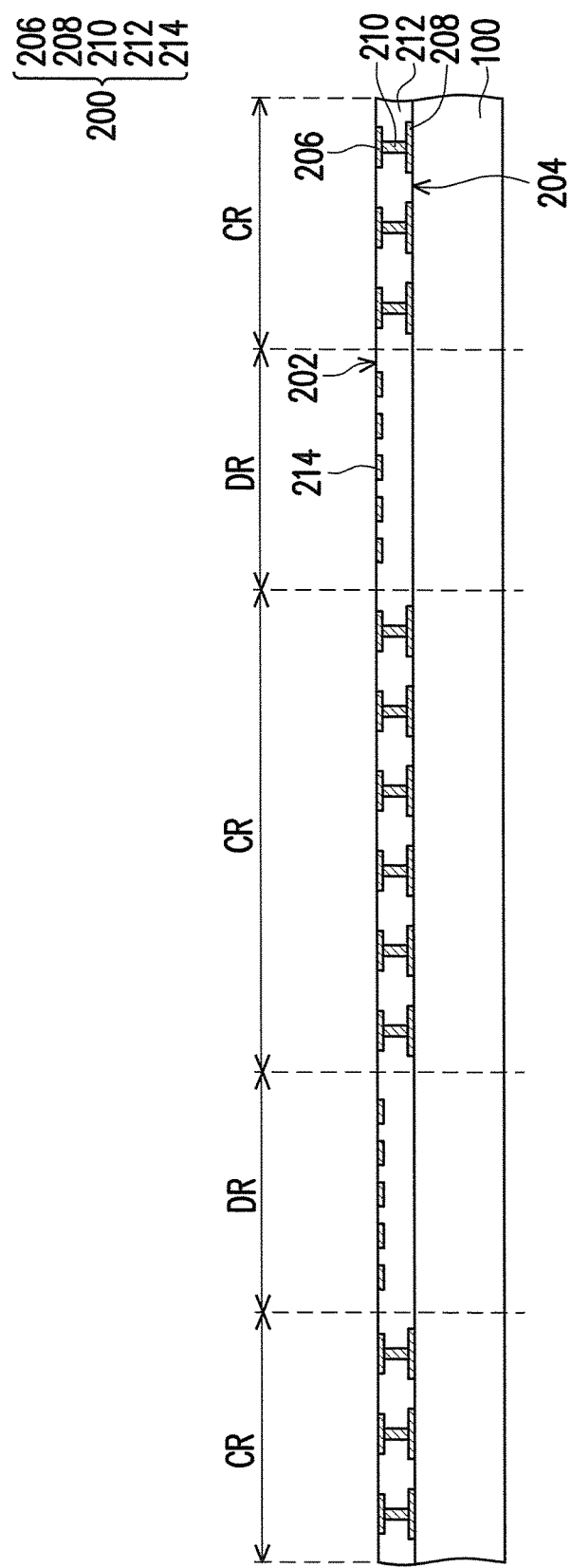
FIG. 1A to FIG. 1I are schematic cross-sectional views illustrating a manufacturing method of a package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1I are schematic cross-sectional views illustrating a manufacturing method of a package structure 10 according to an embodiment of the invention. Referring to FIG. 1A, a redistribution layer (RDL) 200 is formed over a carrier 100. The carrier 100 is, for example, a glass substrate or a glass supporting board. However, they construe no limitation in the invention. Other suitable substrate material may be adapted as the carrier 100 as long the material is able to withstand the subsequent processes while carrying the package structure formed thereon. The RDL 200 has a first surface 202 and a second surface 204 opposite to the first surface 202. The second surface 204 faces the carrier 100. In some embodiments, the second surface 204 may be in direct contact with the carrier 100. However, in order to enhance the releasibility of the RDL 200 from the carrier 100 in the subsequent process, a de-bonding layer (not illustrated) may be disposed between the second surface 204 of the RDL 200 and the carrier 100 in some alternative embodiments. The de-bonding layer is, for example, a LTHC (light to heat conversion) release layer or other suitable release layers. The RDL 200 is divided into a plurality of die attach regions DR and a plurality of contact regions CR, and the contact regions CR surround the die attach regions DR. The RDL includes a first metallic layer 206, a second metallic layer 208, a third metallic layer 214, a plurality of via plug structures 210, and a dielectric layer 212. The first metallic layer 206, the second metallic layer 208, the third metallic layer 214, and the via plug structures 210 are embedded in the dielectric layer 212. However, the dielectric layer 212 exposes at least part of the first metallic layer 206, the second metallic layer 208, and the third metallic layer 214 for future electrical connection purposes. In some embodiments, the first metallic layer 206 and the third metallic layer 214 are the same metallization layer formed through the same process. Moreover, the first metallic layer 206 and the second metallic layer 208 are located in the contact region CR while the third metallic layer 214 is located in the die attach region DR. The first metallic layer 206, the second metallic layer 208, and the third metallic layer 214 are electrically coupled to each other through the via plug structures 210. It should be noted that some metallic layers in the RDL 200 are omitted in the illustration presented in FIG. 1A for simplicity. However, in some alternative embodiments, other than the first metallic layer 206, the second metallic layer 208, and the third metallic layer 214, the RDL 200 may also include additional metallic layers embedded in the dielectric layer 212 based on the circuit design. The RDL 200 has a thickness ranges from 10 µm to 100 µm. Since the RDL 200 is thinner compared to the conventionally known substrate, the RDL 200 in the invention is different from a substrate.

Figure 1B:
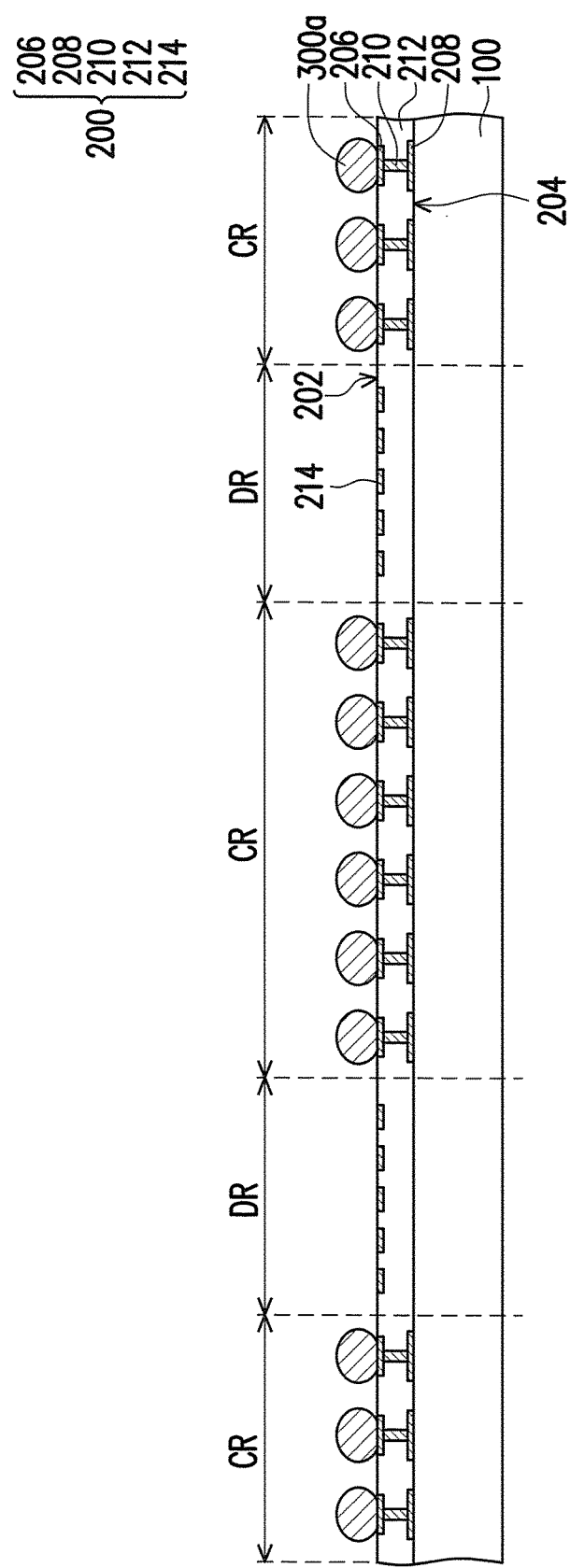

Referring to FIG. 1B, a plurality of conductive terminals 300a are formed over the first surface 202 of the RDL 200 in the contact region CR. In the present embodiments, the conductive terminals 300a are conductive bumps. However, it construes no limitation in the invention. Other possible forms and shapes of the conductive terminals 300a may be utilized, and the details with respect to other types of conductive terminals 300a will be described later in other embodiments. The conductive terminal (conductive bumps) 300a may be formed by a ball placement process. For example, a stencil (not illustrated) having openings corresponding to the first metallic layer 206 of the RDL 200 is provided over the first surface 202 of the RDL 200. Subsequently, a layer of flux is printed on the first metallic layer 206 exposed by the openings of the stencil. Thereafter, conductive balls (for example, solder balls, gold balls, copper balls, nickel balls, or the like) are placed over the stencil. The conductive balls are subjected to a specific vibration frequency such that the conductive balls are dropped into the opening of the stencil. Afterwards, a reflow process may be performed to enhance the attachment between the conductive balls and the first metallic layer 206, so as to form conductive terminals 300a. The conductive terminals 300a are electrically connected to the first metallic layer 206 of the RDL 200.

Figure 1C:
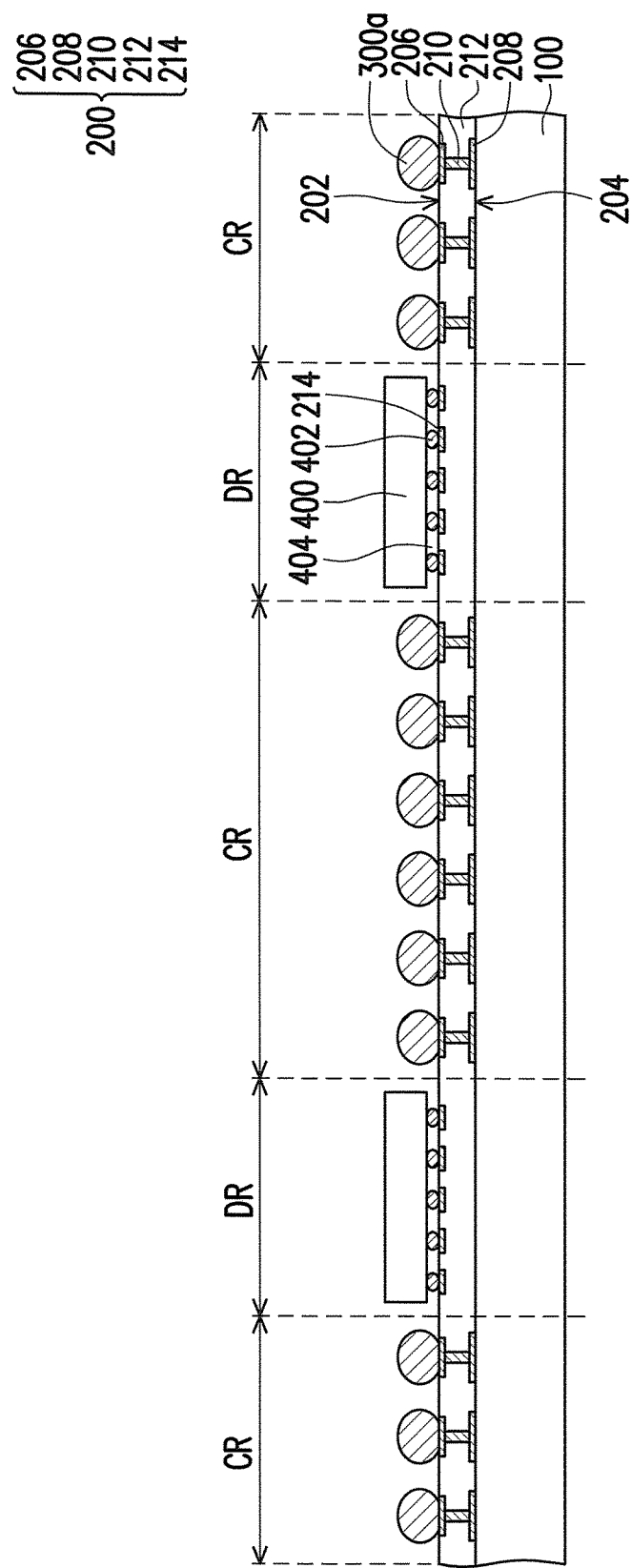

Referring to FIG. 1C, a plurality of first dies 400 are formed over the first surface 202 of the RDL 200 in the die attach region DR. Since the contact regions CR surround the die attach regions DR, the conductive terminals 300a formed in the contact regions CR also surround the first dies 400. The first dies 400 are attached to the third metallic layer 214 in a flip-chip manner to electrically connect with the RDL 200. In other words, the active surface of each of the first dies 400 is bonded to the third metallic layer 214 of RDL 200 through bumps 402. Furthermore, an underfill 404 may be formed in the gap between the first dies 400 and the RDL 200, so as to enhance the reliability of the attachment process. The first dies 400 are, for example, an ASIC (Application-Specific Integrated Circuit). However, it construes no limitation in the invention. Other suitable active devices may also be utilized as the first dies 400. Moreover, it should be noted that only one first die 400 is shown in each of the die attach region DR in FIG. 1C, but the number of the first dies 400 located within each of the die attach region DR is not limited thereto. In other embodiments, multiple first dies 400 may be stacked with each other in each of the die attach region DR. Since the third metallic layer 214 is electrically connected to the first metallic layer 206, the first dies 400 are electrically connected to the conductive terminals 300a through the bumps 402, the third metallic layer 214, and the first metallic layer 206.

Figure 1D:
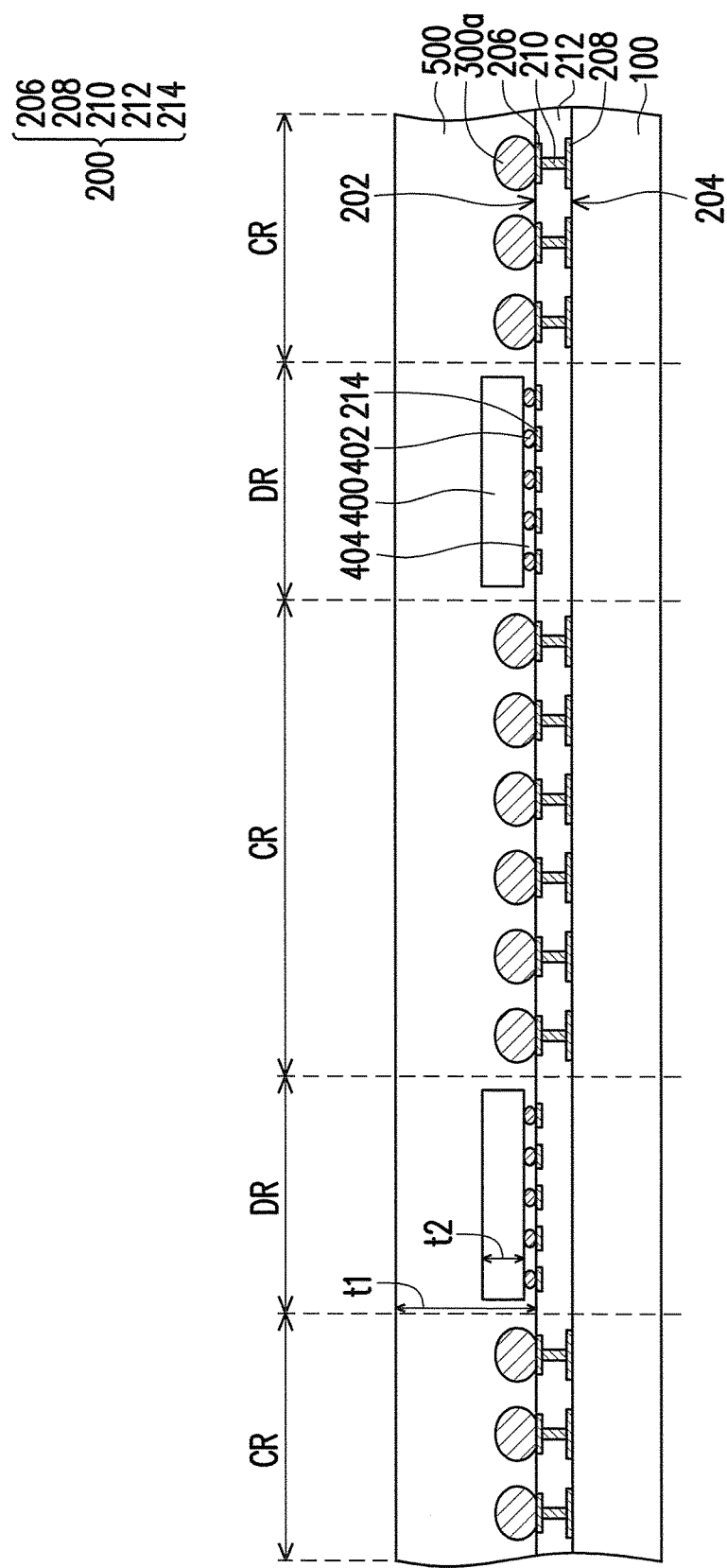
Figure 1E:
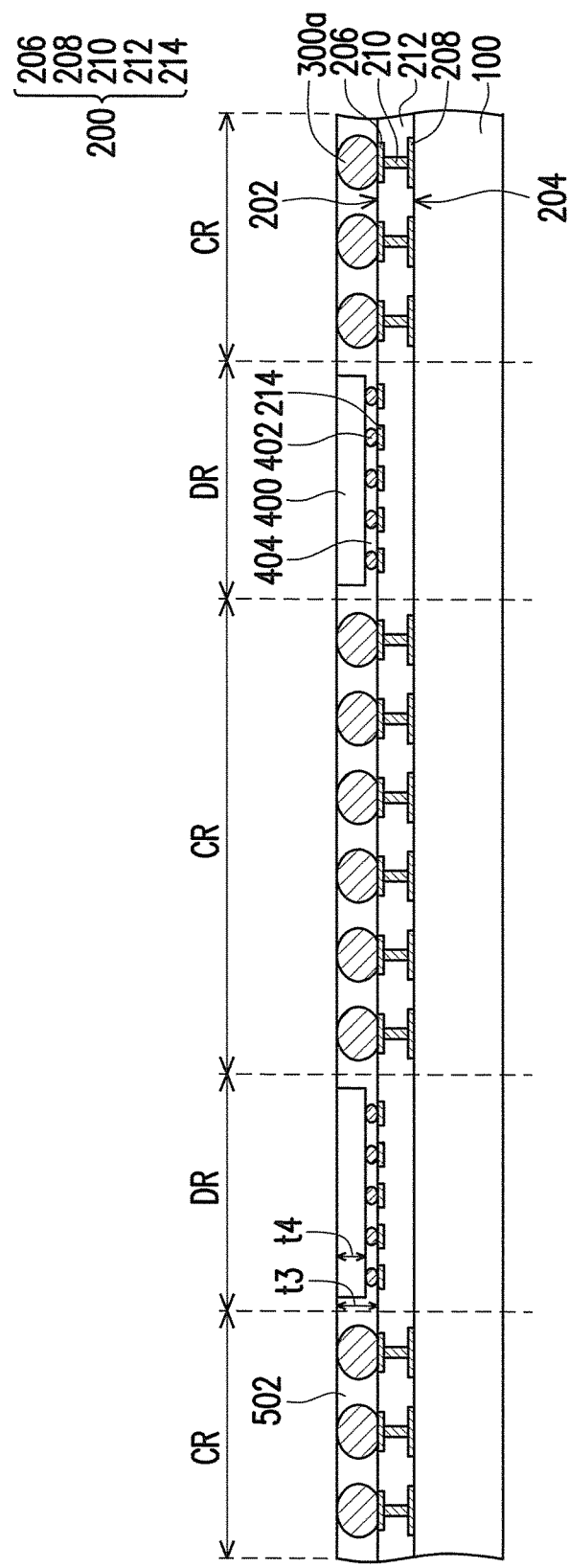

Referring to FIG. 1D and FIG. 1E, a first encapsulant 502 is, formed over the first surface 202 of the RDL 200 to encapsulate the first dies 400 and the conductive terminals 300a. Specifically, referring to FIG. 1D, an encapsulating material 500 is formed over the first dies 400 and the conductive terminals 300a. The first dies 400 and the conductive terminals 300a are completely encapsulated by the encapsulating material 500. In some embodiments, the encapsulating material 500 may be a molding compound formed by molding processes. However, in some alternative embodiments, the encapsulating material 500 may be formed by an insulating material such as epoxy or other suitable resins. The encapsulating material 500 has a thickness of t1 and the first dies 400 have a thickness of t2. Subsequently, the thickness t1 of the encapsulating material 500 and the thickness t2 of the first dies 400 are respectively reduced to thickness t3 and thickness t4, so as to form the first encapsulant 502 which exposes at least part of the conductive terminals 300a. In some embodiments, the thicknesses t1 and t2 may be reduced through grinding. For example, a chemical mechanical polishing (CMP) technique may be adapted. It should be noted that in the present embodiment, the first dies 400 are taller than the conductive terminals 300a, as illustrated in FIG. 1D. Thus, in order to expose the conductive terminals 300a, the first dies 400 are grinded. However, in some alternative embodiments, the grinding of the first dies 400 may be optional when the first dies 400 are shorter than the conductive terminals 300a. Moreover, since the active surface of each of the first dies 400 faces downward, the first dies 400 may be grinded to desired thicknesses without affecting the electrical properties thereof. It should be noted that the thickness t4 of the first dies 400 is not particularly limited, and the thickness t4 may vary depending on the number of first dies 400 within each of the die attach region DR. However, the grinding of the first dies 400 is able to aid the thickness reduction in the package structure as a whole, thereby achieving package miniaturization. It should be noted that in the present embodiments, the encapsulation of the first dies 400 and the encapsulation of the conductive terminals 300a are performed simultaneously. However, in some alternative embodiments, the encapsulation of the first dies 400 and the encapsulation of the conductive terminals 300a may be conducted by different manufacturing steps, and the details will be presented in later embodiments.

Figure 1F:
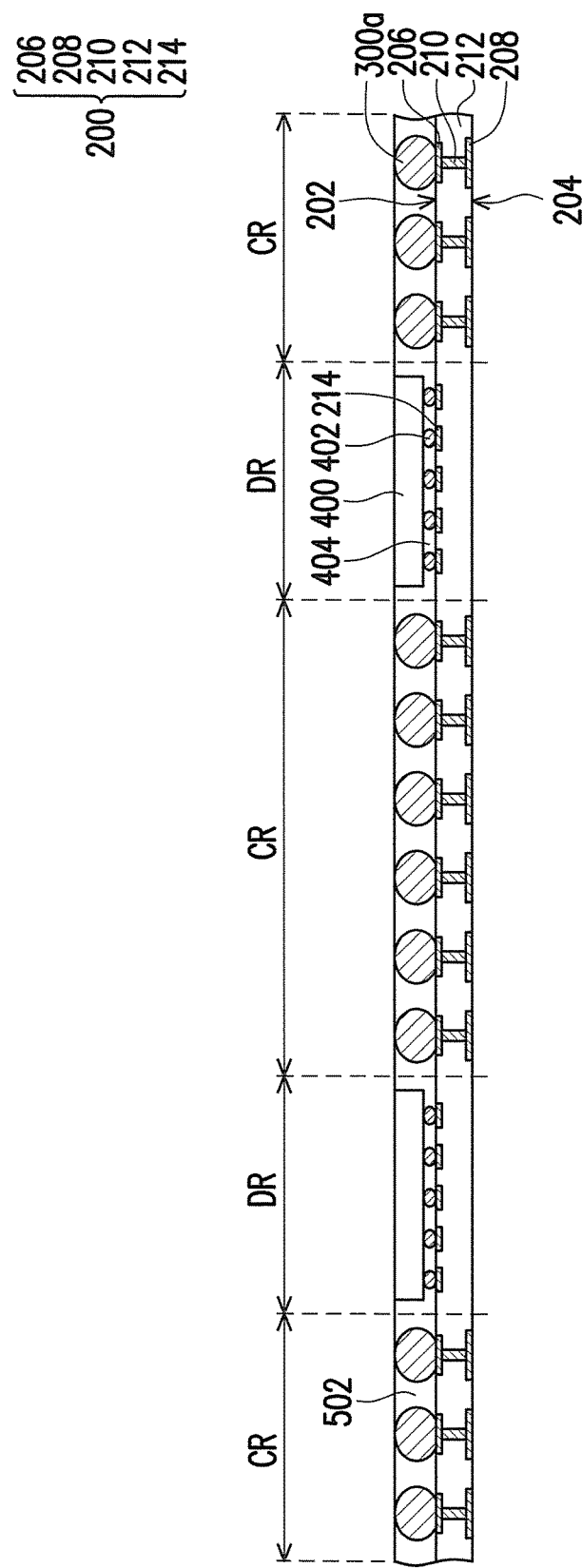

Referring to FIG. 1F, the second surface 204 of the RDL 200 is separated from the carrier 100. For example, the RDL 200 may be separated from the carrier 100 through chemical etching. Alternatively, as mentioned above, the de-bonding layer (not illustrated) may be disposed between the second surface 204 of the RDL 200 and the carrier 100. Therefore, external energy (for example, UV laser, visible light, or heat) may be applied to the de-bonding layer, so as to allow the RDL 200 to peel off from the carrier 100. In addition, an ENIG (electroless nickel immersion gold) plating process may be performed on the first metallic layer 206, the second metallic layer 208, and the third metallic layer 214 to enhance the electrical connection reliability in the subsequent processes.

Figure 1G:
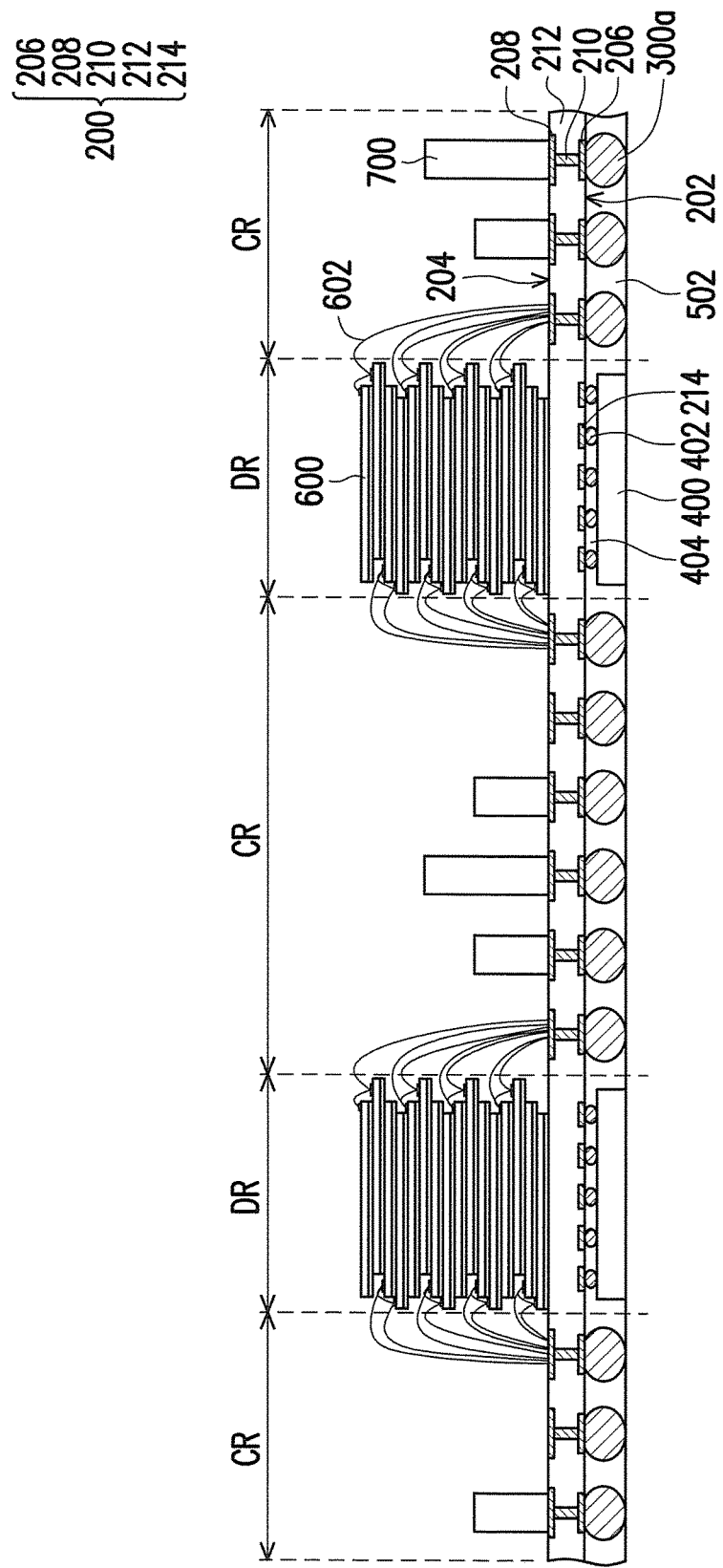

Referring to FIG. 1G, the structure presented in FIG. 1F is flipped upside down such that the second surface 204 faces upward. A plurality of second dies 600 and a plurality of passive components 700 are formed over the second surface 204 of the RDL 200. The second dies 600 are formed in the die attach regions DR while the passive components 700 are formed in the contact regions CR. The second dies 600 are, for example, memory devices such as NAND flash die. However, it construes no limitation in the invention. Other suitable chips may also be utilized as the second dies 600. A die attach film (not illustrated) may be formed between the second dies 600 and the RDL 200, so as to enhance the adhesion between the second dies 600 and the RDL 200. The second dies 600 are electrically connected to the second metallic layer 208 of the RDL 200 through wires 602. In other words, the second dies 600 are electrically connected to the conductive terminals 300a through the wires 602, the second metallic layer 208, the via plug structures 210, and the first metallic layer 206. The passive components 700 are formed on the second metallic layer 208 in the contact regions CR. In some embodiments, the passive components 700 are disposed corresponding to the conductive terminals 300a. However, it construes no limitation in the invention. The passive components 700 may be disposed in any manner as long as the passive components 700 are electrically connected to the second metallic layer 208 of the RDL 200. Similar to the second dies 600, the passive components 700 are also electrically connected to the conductive terminals 300a. Examples of the passive components 700 include capacitors, resistors, inductors, fuses, or antennas.

Figure 1H:
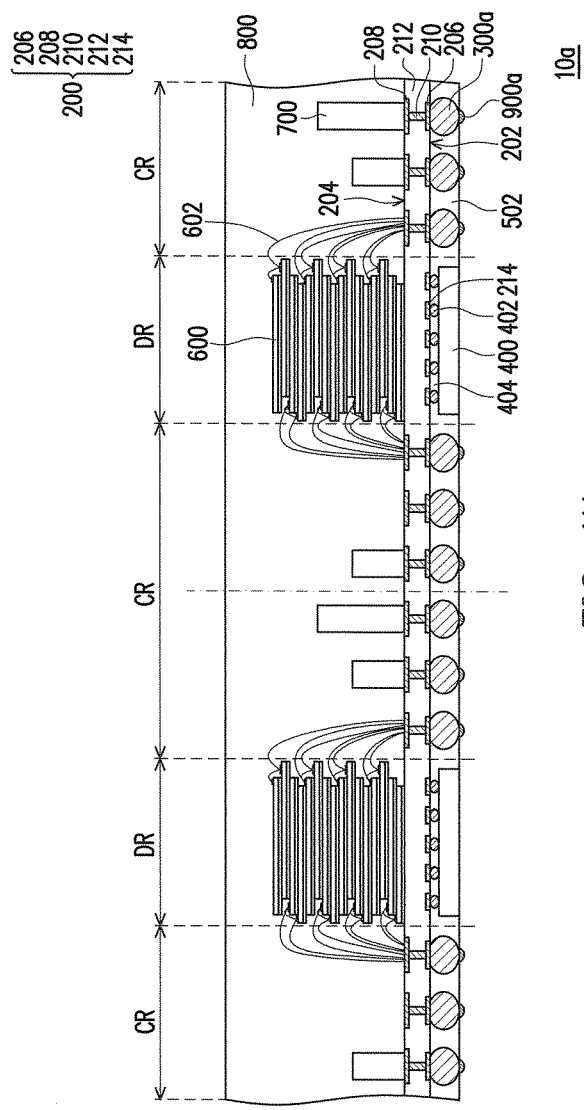
Figure 1I:
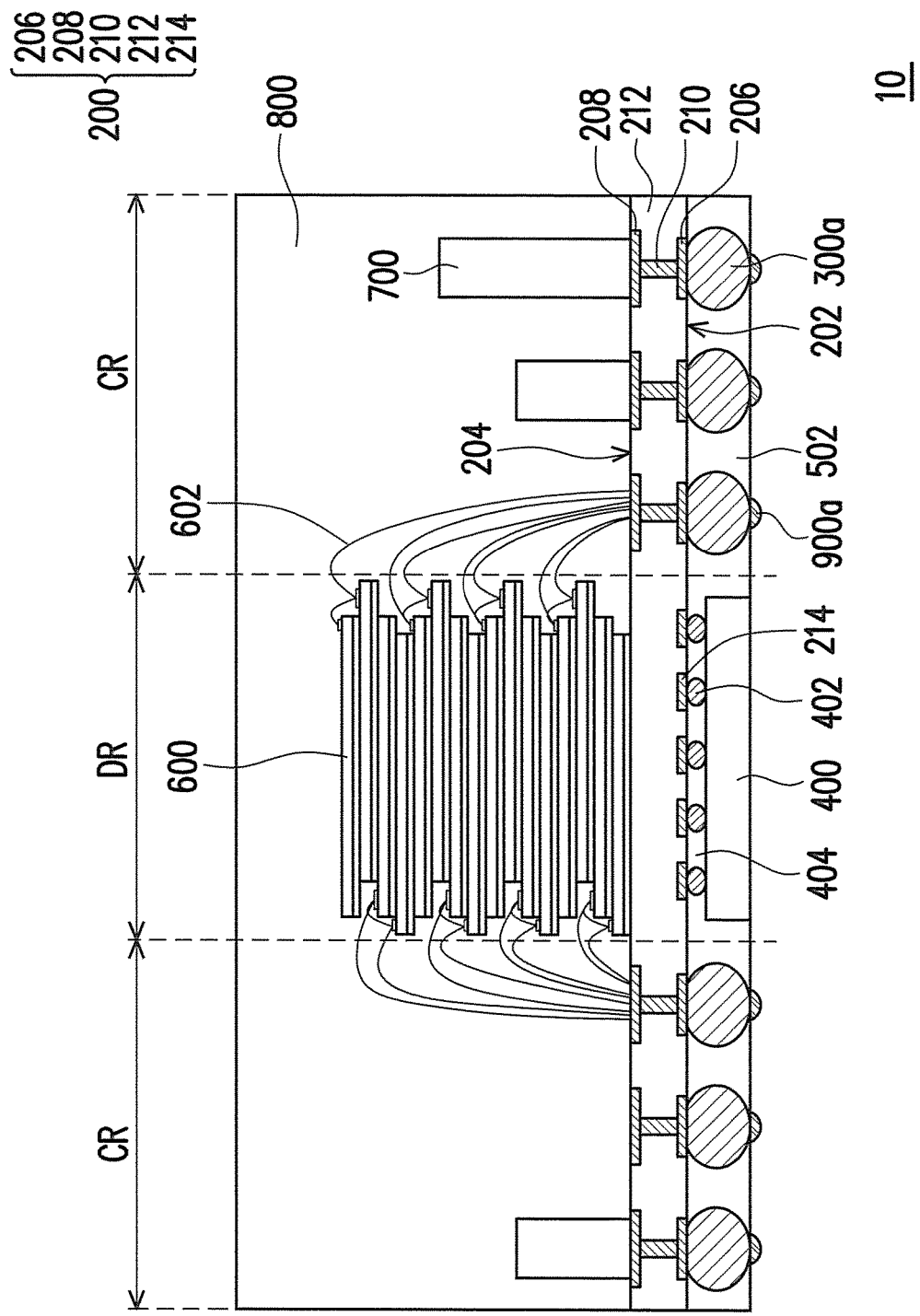

Referring to FIG. 1H to FIG. 1I, a second encapsulant 800 is formed to encapsulate the second dies 600 and the passive components 700. Similar to the first encapsulant 700, the second encapsulant 800 is also formed by a molding compound or an insulating material. Moreover, a plurality of solder balls 900a are formed over the conductive terminals 300a to enhance electrical connection with other package structures. Specifically, similar to that of the conductive terminals 300a, the solder balls 900a may also be formed by a ball placement process. As mentioned above, at least part of the conductive terminals 300a are exposed by the first encapsulant 502. Thus, the solder balls 900a are formed on the exposed part of the conductive terminals 300a to render electrical connection. Herein, the manufacturing process of a package structure array 10a is substantially completed. Thereafter, a dicing or singulation process is performed on the package structure array 10a, so as to render a plurality of package structures 10 illustrated in FIG. 1I. The singulation process includes, for example, cutting with rotating blade or laser beam.

Referring FIG. 1I, the first die 400 and the second dies 600 are respectively formed on the first surface 202 and the second surface 204 of the RDL 200. Therefore, a substrate having a large thickness may be eliminated in the package structure 10. Moreover, since the first die 400 is disposed in a flip-manner, the first die 400 may be grinded to any desired thickness. Furthermore, as illustrated in FIG. 1I, the first die 400 is coplanar with the conductive terminals 300a. As such, a thickness of the package structure 10 may be effectively reduced, so as to achieve miniaturization in the package structure 10.

FIG. 2A to FIG. 2K are schematic cross-sectional views illustrating a manufacturing method of a package structure 20 according to an embodiment of the invention. The present embodiment is similar to the embodiment illustrated in FIG. 1A to FIG. 1I, and the difference lies in that in the present embodiment, the conductive terminals 300b are conductive pillars.

Figure 2A:
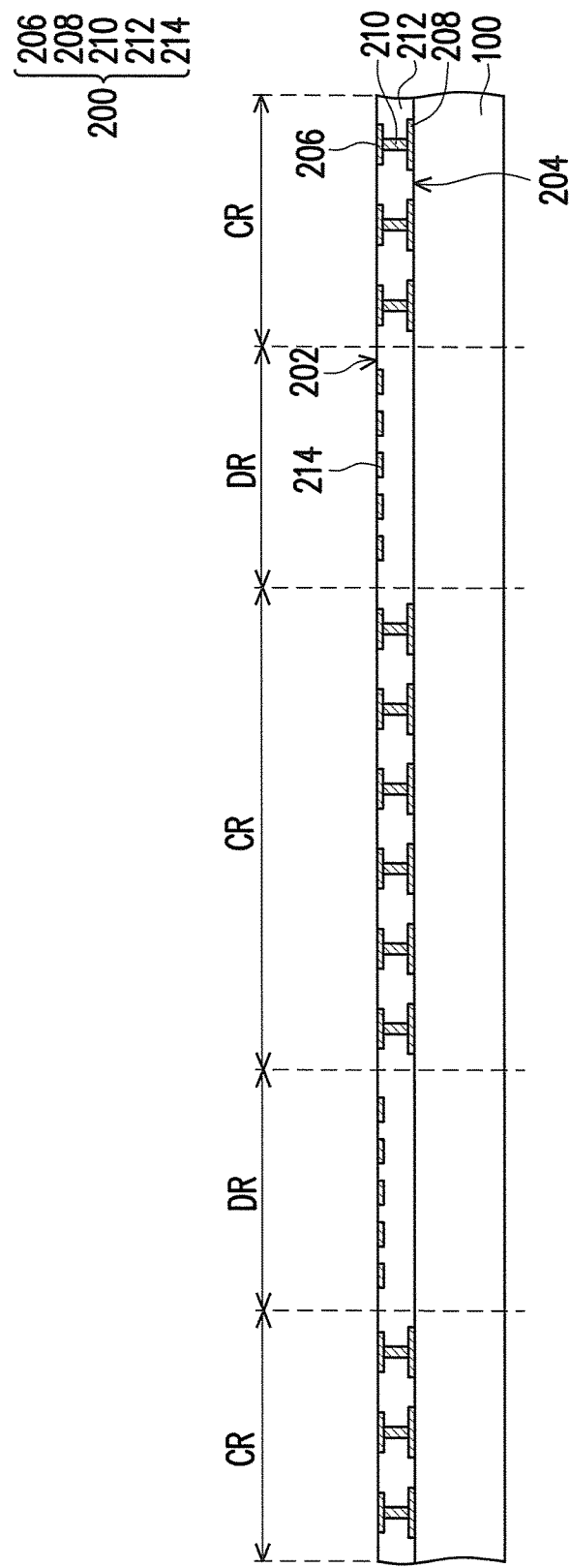
Figure 2B:
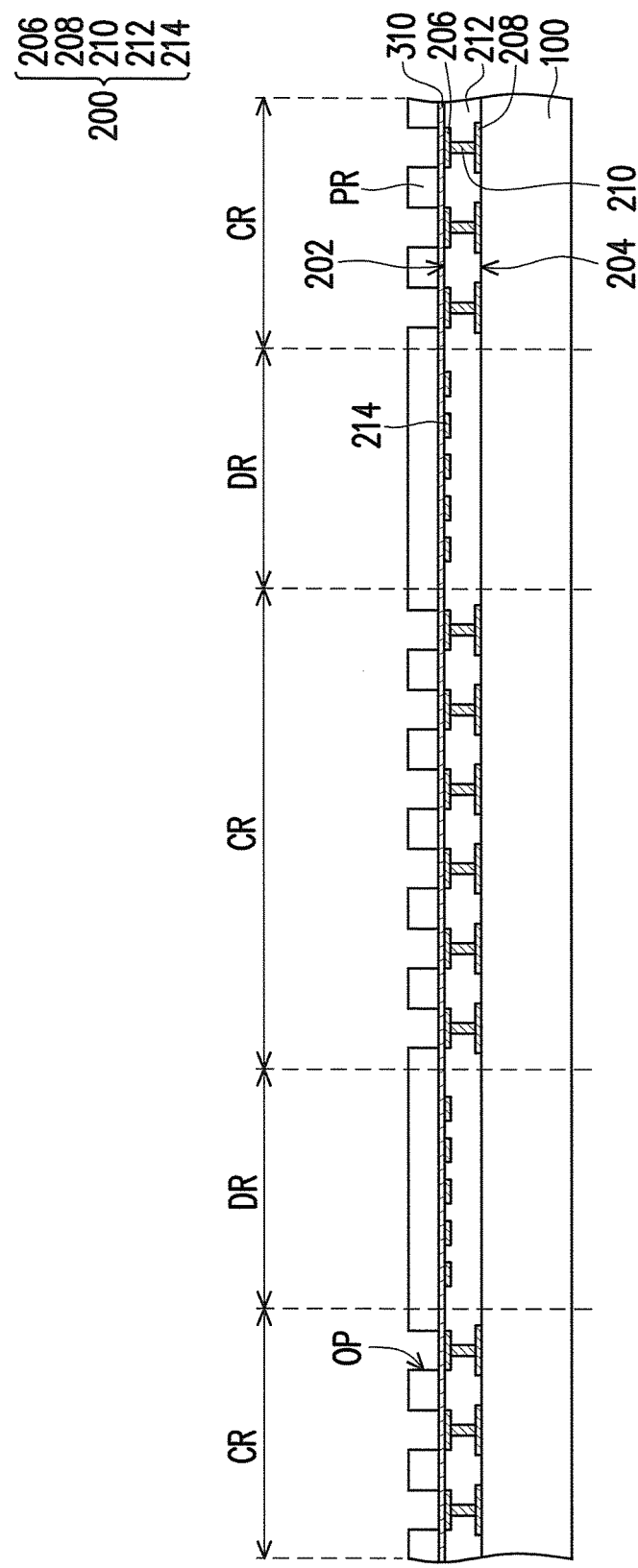

Referring to FIG. 2A, a redistribution layer (RDL) 200 is formed over a carrier 100. The RDL 200 and the carrier 100 are similar to the embodiment in FIG. 1A, so the detailed descriptions will be omitted herein. Referring to FIG. 2B, a seed layer 310 is formed over the first surface 202 of the RDL 200. A material of the seed layer 310 is, for example, copper, solder, gold, nickel, or an alloy thereof. A method of forming the seed layer 310 is, for example, an electroless plating process, a chemical plating process, a thermal evaporation process, or a sputtering process. Subsequently, a photoresist PR is formed over the seed layer 310. The photoresist PR is a patterned layer and has openings OP which exposes at least part of the seed layer 310. Specifically, the seed layer 310 exposed by the openings OP of the photoresist PR corresponds to the locations of the first metallic layer 206. The photoresist layer PR includes, for example, photosensitive resin or other photosensitive materials.

Figure 2C:
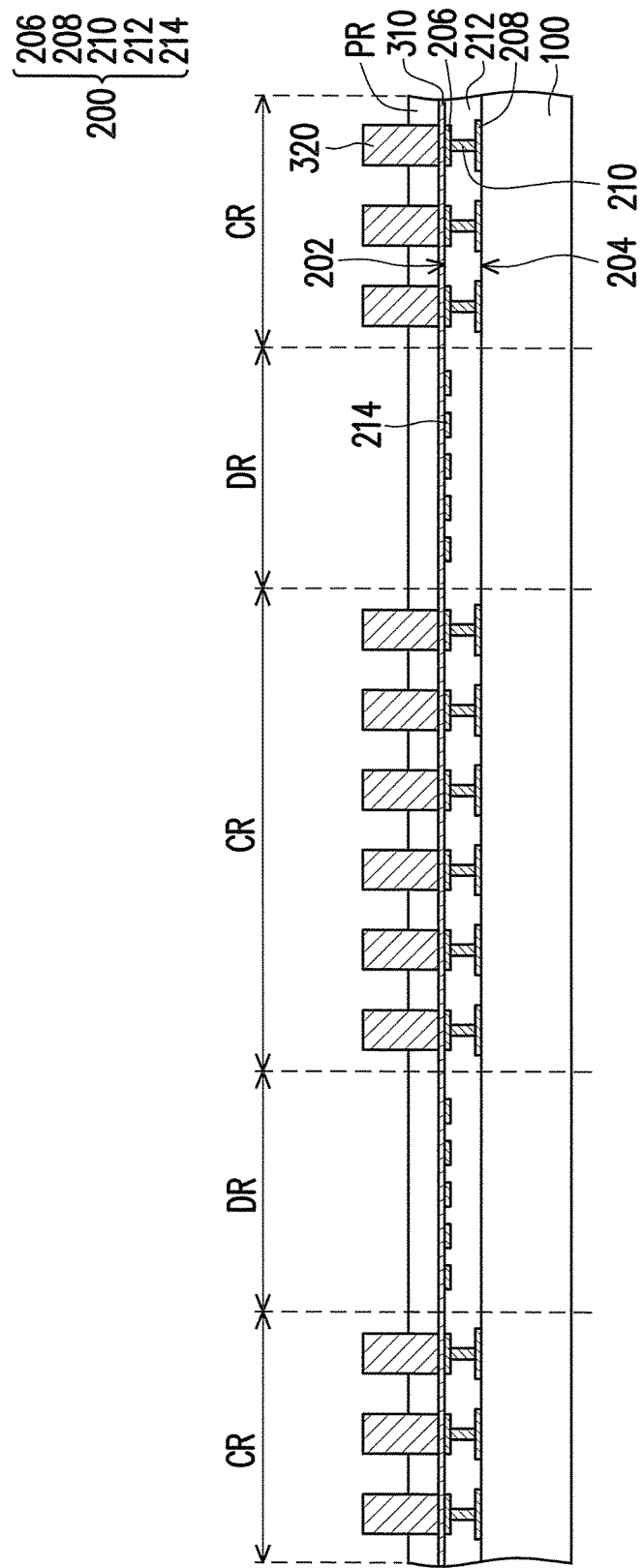

Referring to FIG. 2C, a conductive material 320 is filled into the openings OP of the photoresist PR. In other words, the conductive material 320 is formed on the seed layer 310 exposed by the photoresist PR. The conductive material 320 includes, for example, solder paste, gold, copper, nickel, or other conductive elements.

Figure 2D:
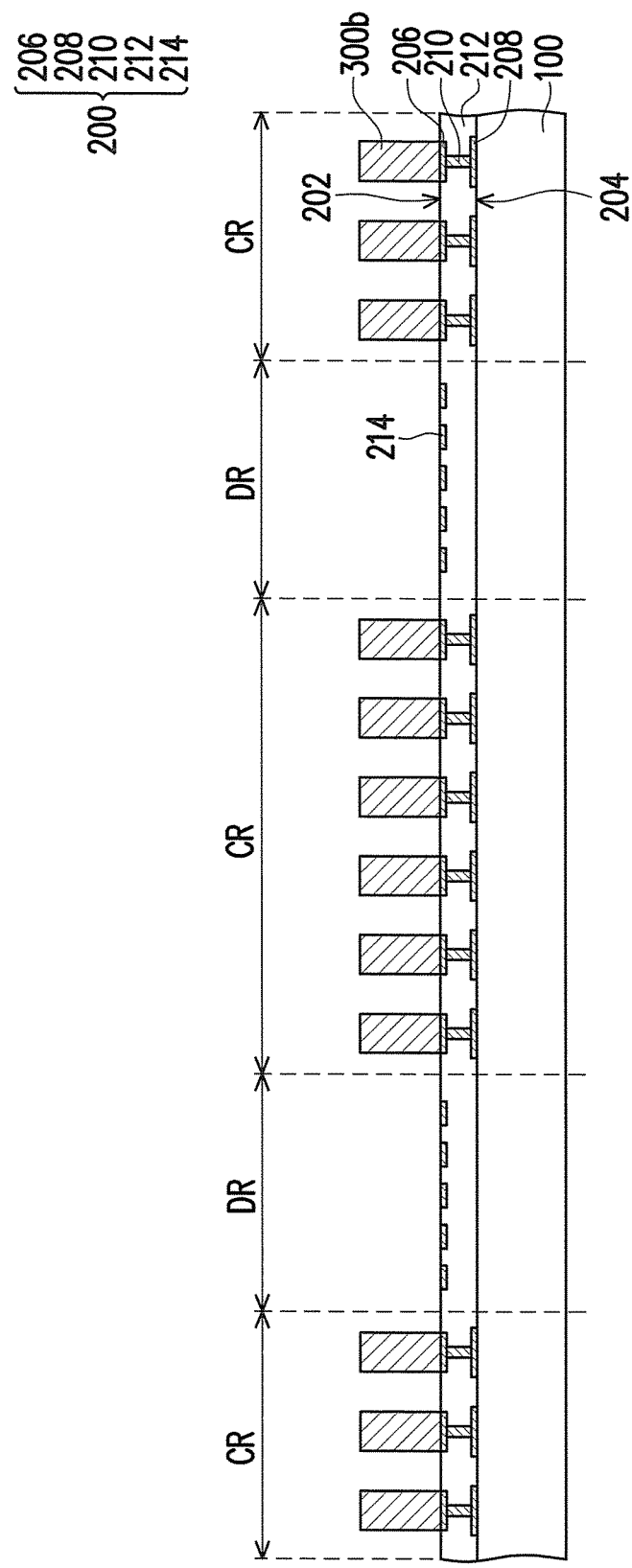
Figure 2E:
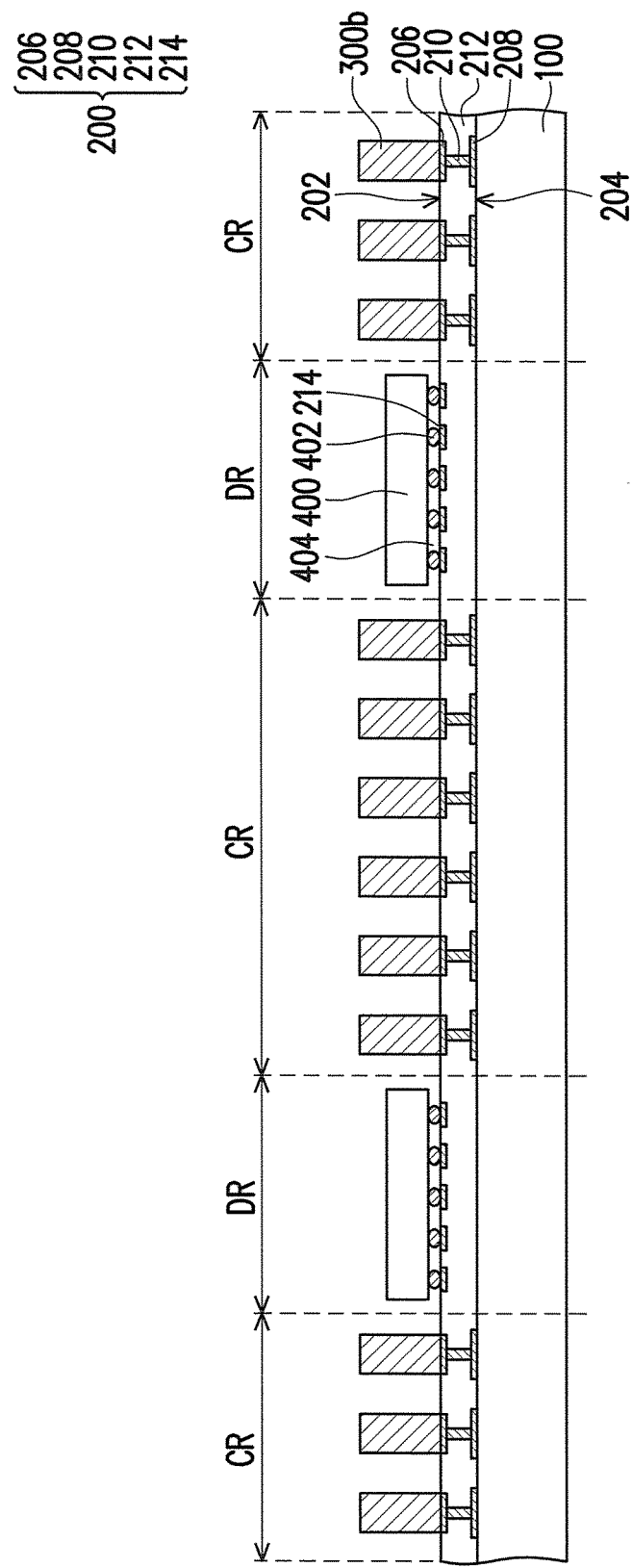
Figure 2F:
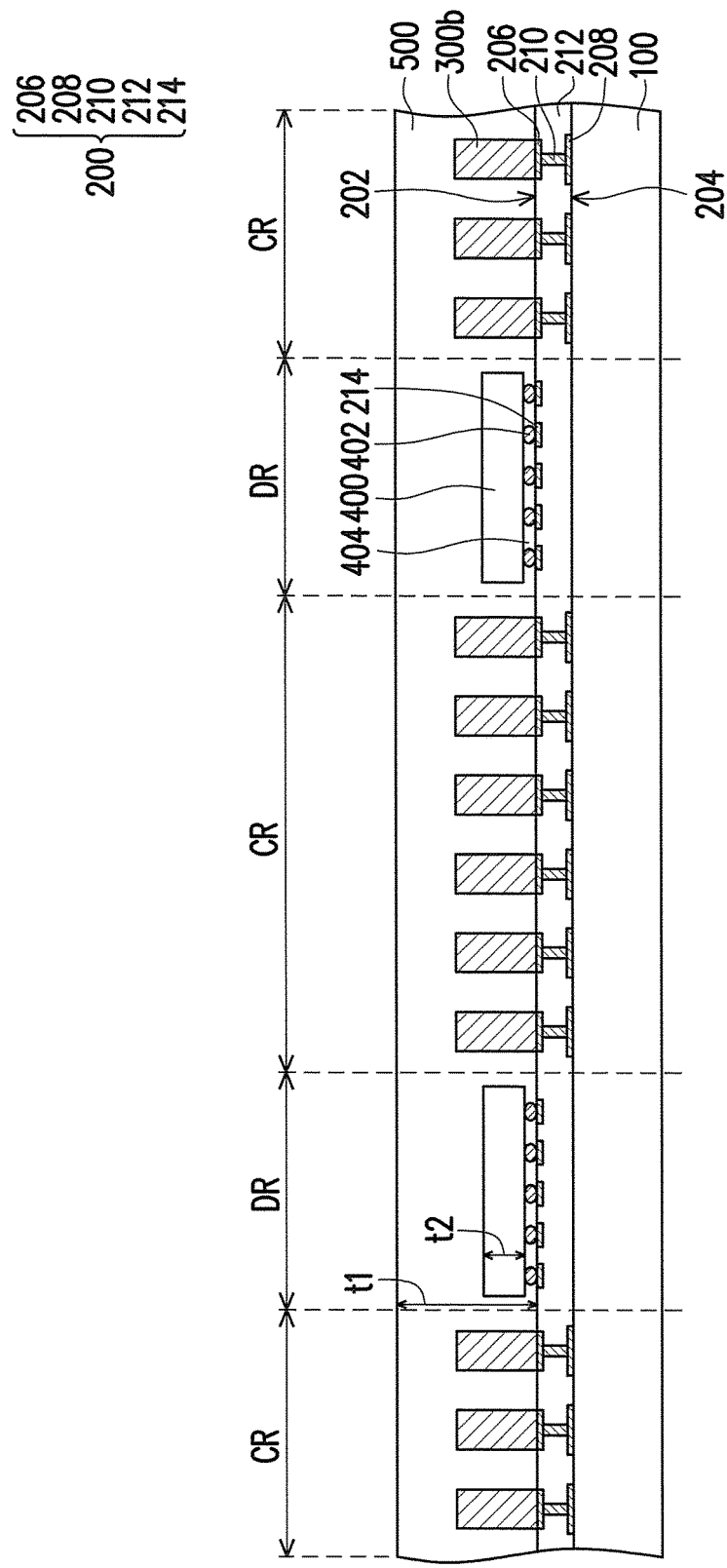
Figure 2G:
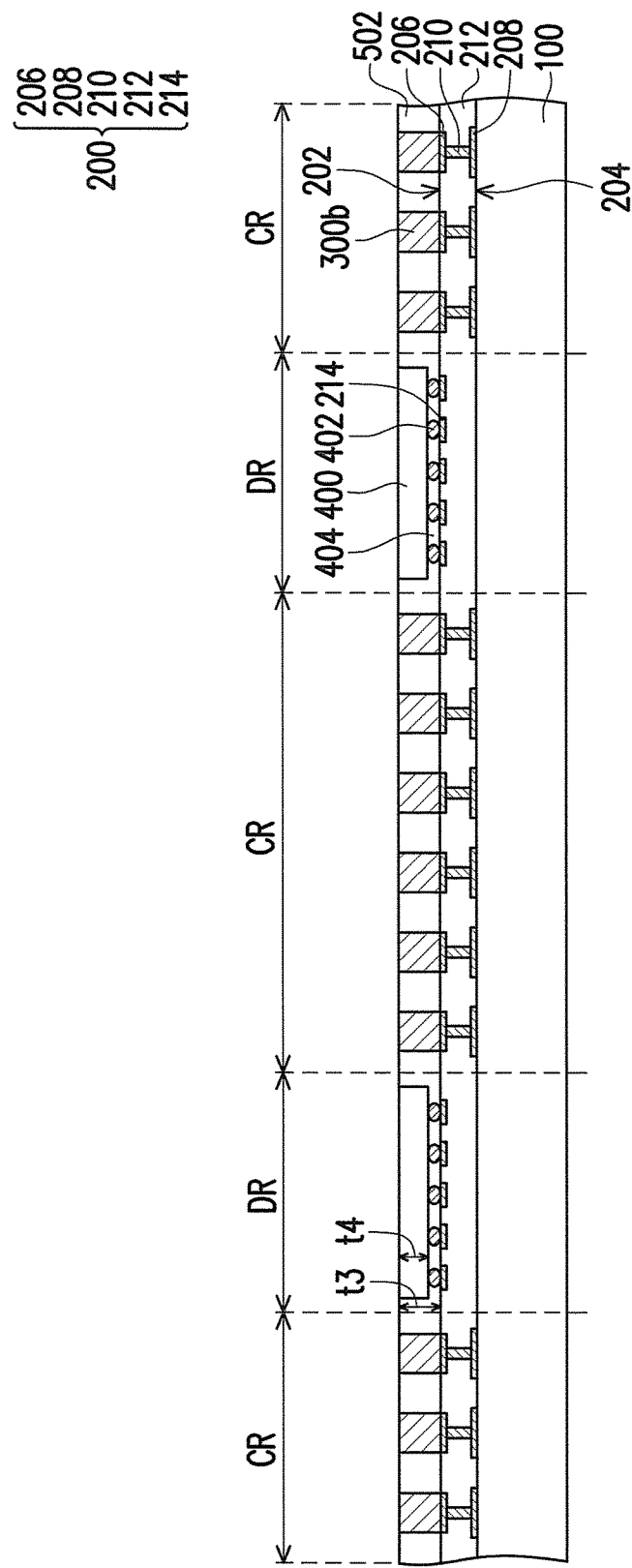
Figure 2H:
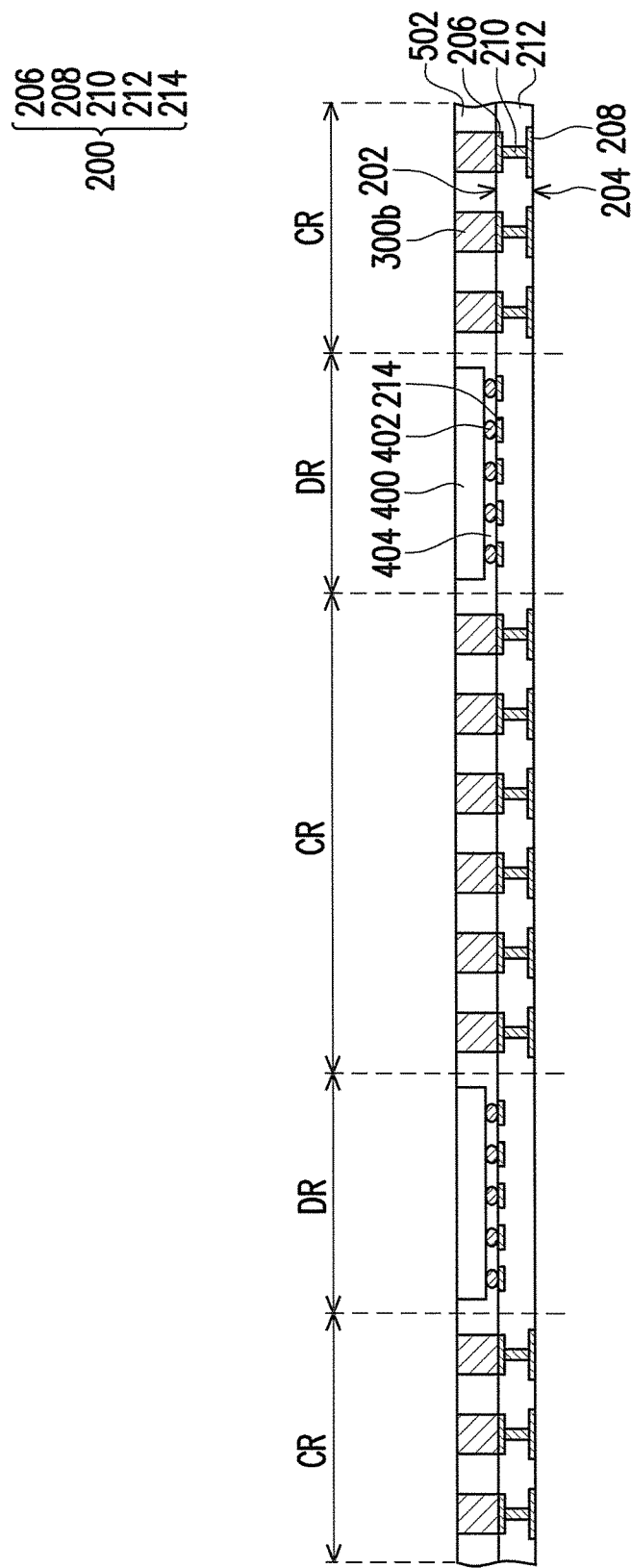
Figure 21:
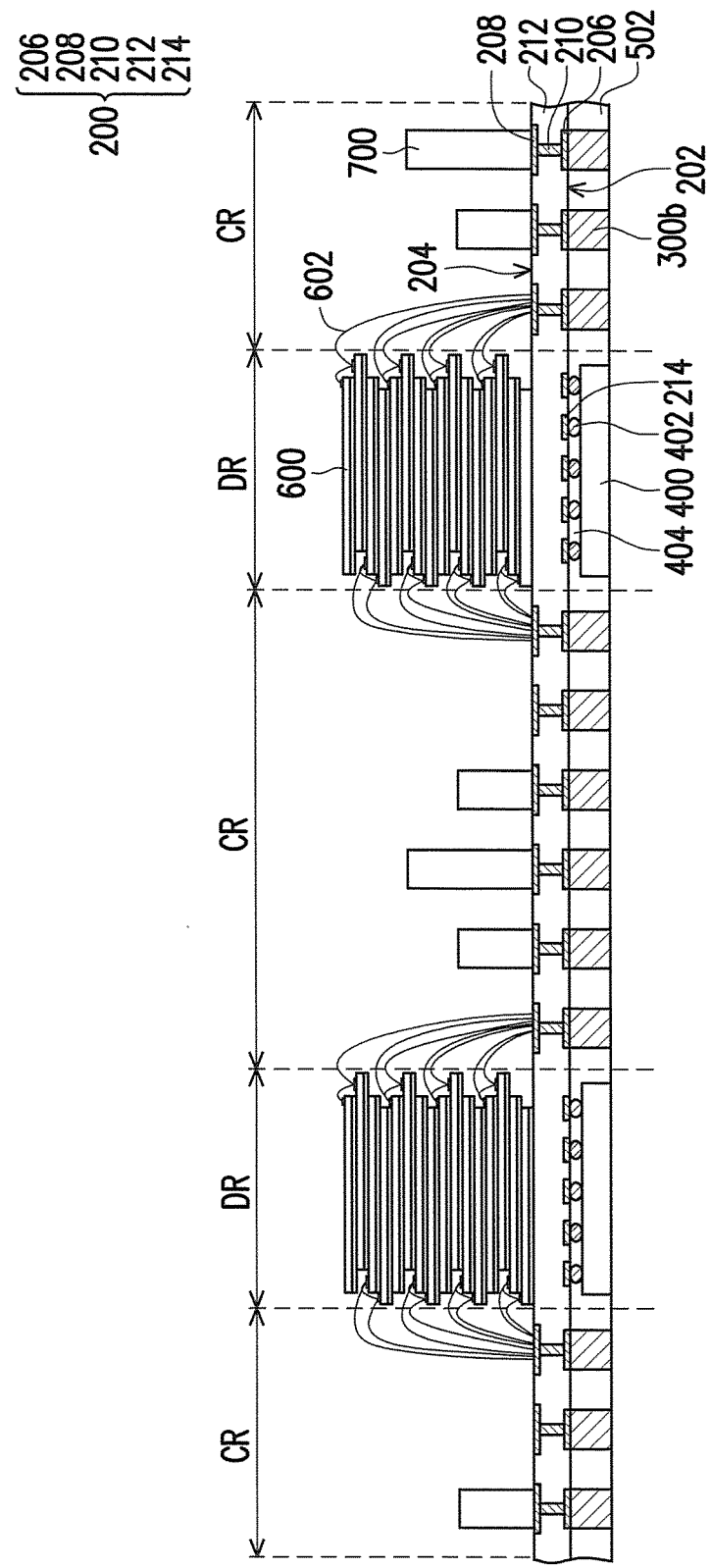

Referring to FIG. 2D, the photoresist PR and the seed layer 310 exposed by the conductive material 320 are removed, so as to form the conductive terminals (conductive pillars) 300b on the first metallic layer 206. In other words, the conductive terminals 300b are formed by removing the photoresist PR and the seed layer 310 covered by the photoresist PR. As such, part of the seed layer 310 and the conductive material 320 constitutes the conductive terminals 300b. Examples of the conductive terminals 300b include solder pillars, gold pillars, copper pillars, nickel pillars, or the like.

Figure 2J:
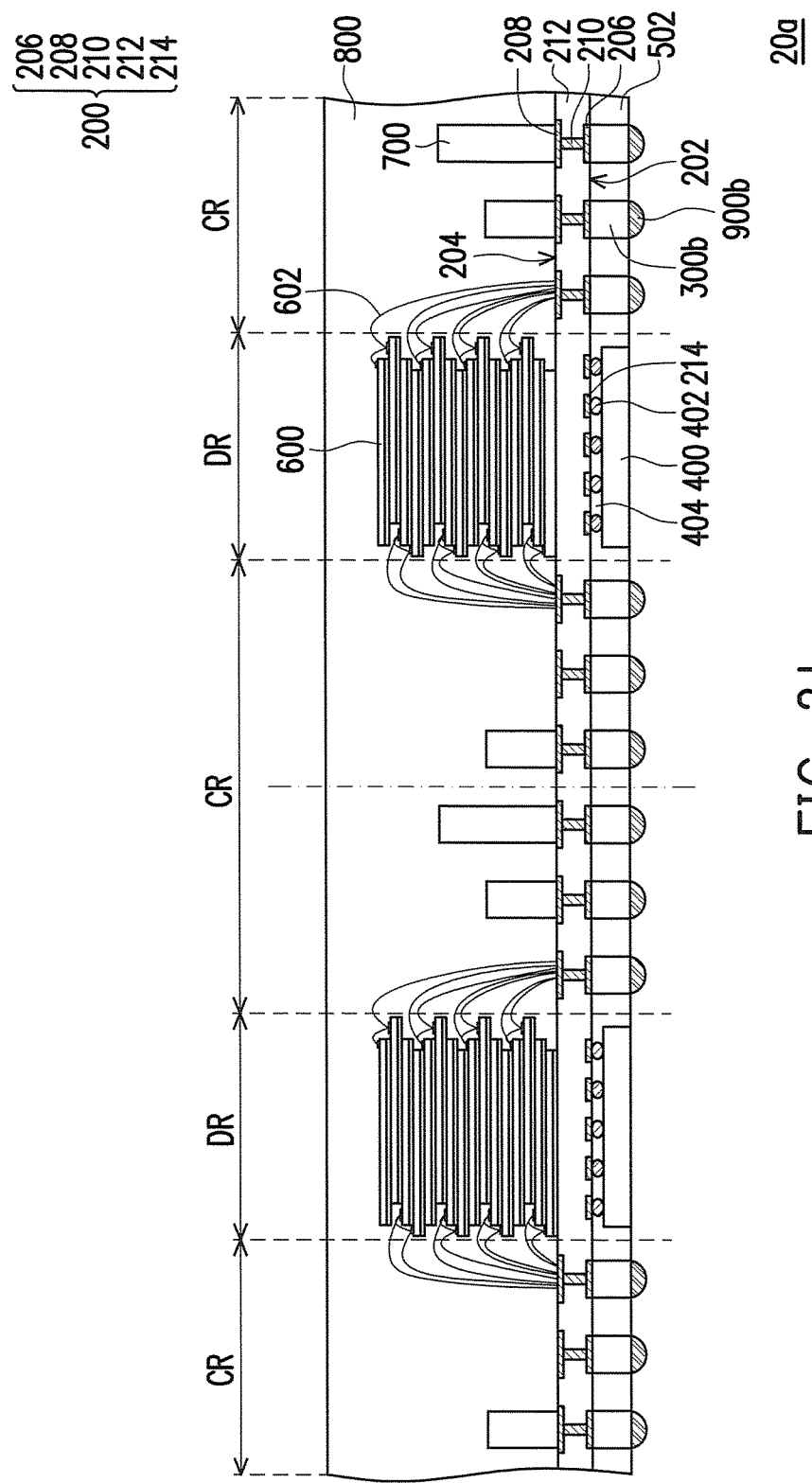

Referring to FIG. 2E to FIG. 2J, the processes are similar to the processes presented in FIG. 1C to FIG. 1H, so the detailed descriptions will be omitted herein. Referring to FIG. 2J, in the present embodiment, solder balls 900b are formed over the conductive terminals 300b to enhance electrical connection with other package structures. The solder balls 900b are formed over the conductive terminals 300b exposed by the first encapsulant 502 through a ball placement process. Similar to the package structure array 10a in FIG. 1H, a singulation process is also performed on the package structure array 20a of the present embodiment to render a plurality of package structures 20, as illustrated in FIG. 2K.

Figure 2K:
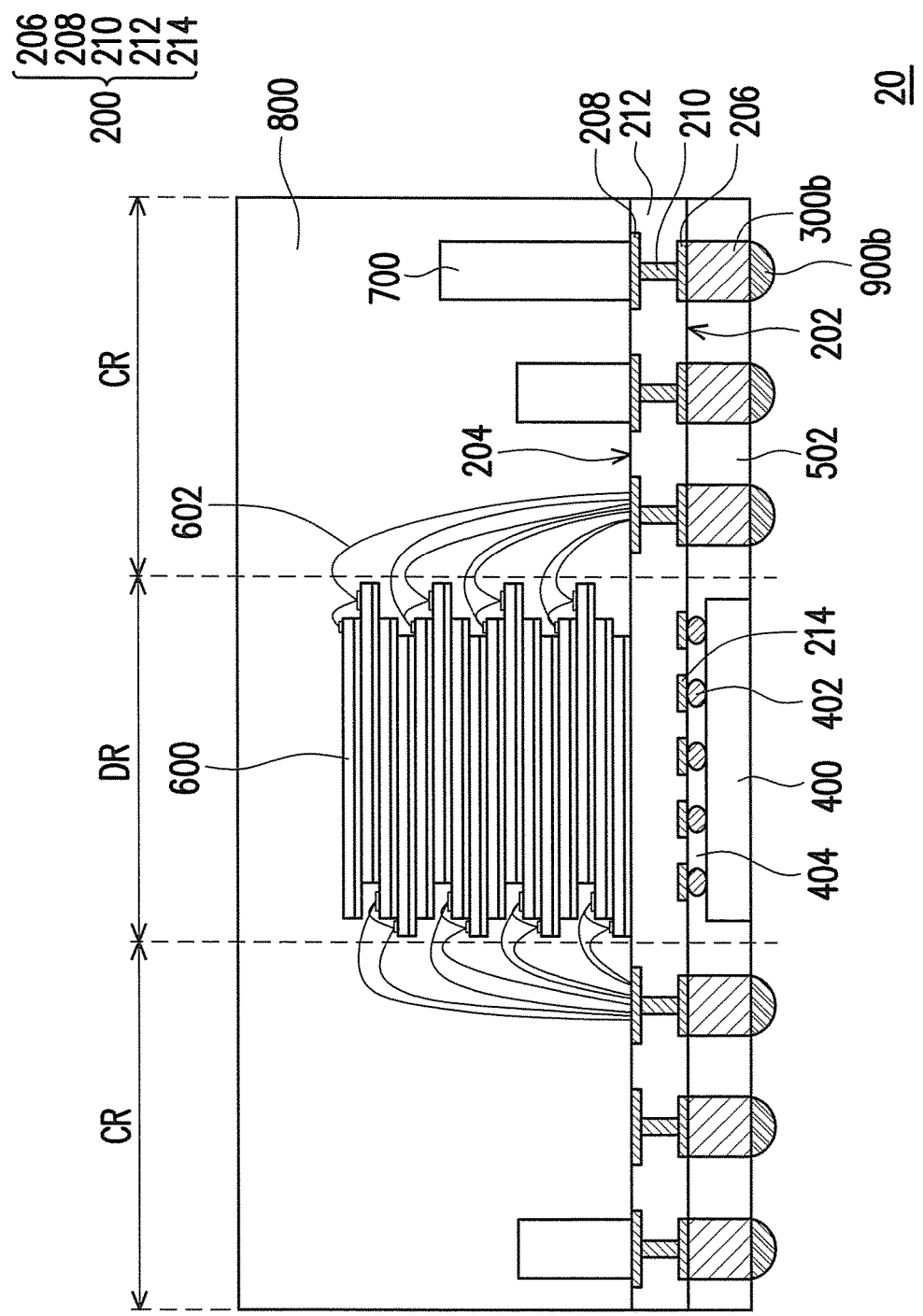

Referring FIG. 2K, the first die 400 and the second dies 600 are respectively formed on the first surface 202 and the second surface 204 of the RDL 200. Therefore, a substrate having a large thickness may be eliminated in the package structure 20. Moreover, since the first die 400 is disposed in a flip-chip manner, the first die 400 may be grinded to any desired thickness. Furthermore, as illustrated in FIG. 2K, the first die 400 is coplanar with the conductive terminals 300b. As such, a thickness of the package structure 20 may be effectively reduced, so as to achieve miniaturization in the package structure 20.

FIG. 3A to FIG. 3I are schematic cross-sectional views illustrating a manufacturing method of a package structure 30 according to an embodiment of the invention. The present embodiment is similar to the embodiment illustrated in FIG. 1A to FIG. 1I, and the difference lies in that in the present embodiment, the conductive terminals 300c are through molding vias (TMV). In detail, the conductive terminals 300c are formed after the first dies 400 has been encapsulated by the first encapsulant 502.

Figure 3A:
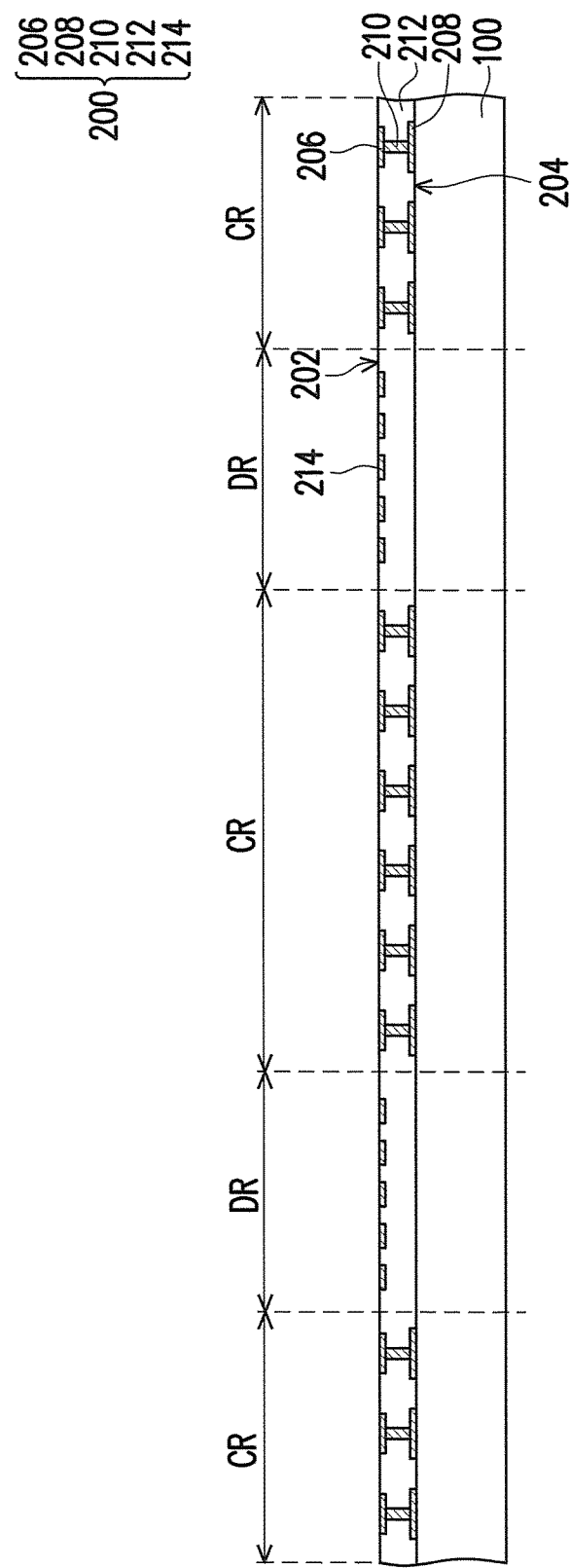
FIG. 3A to FIG. 3I are schematic cross-sectional views illustrating a manufacturing method of a package structure according to an embodiment of the invention.
Figure 3B:
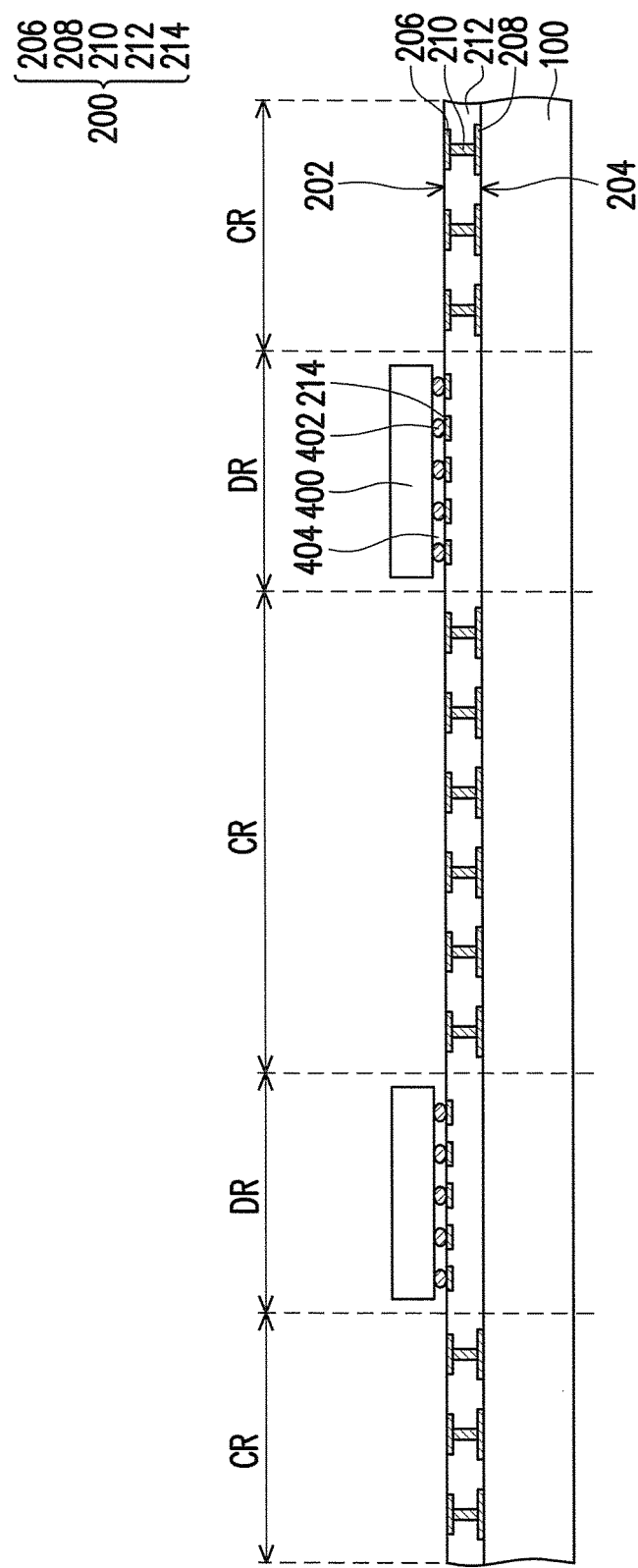
Figure 3C:
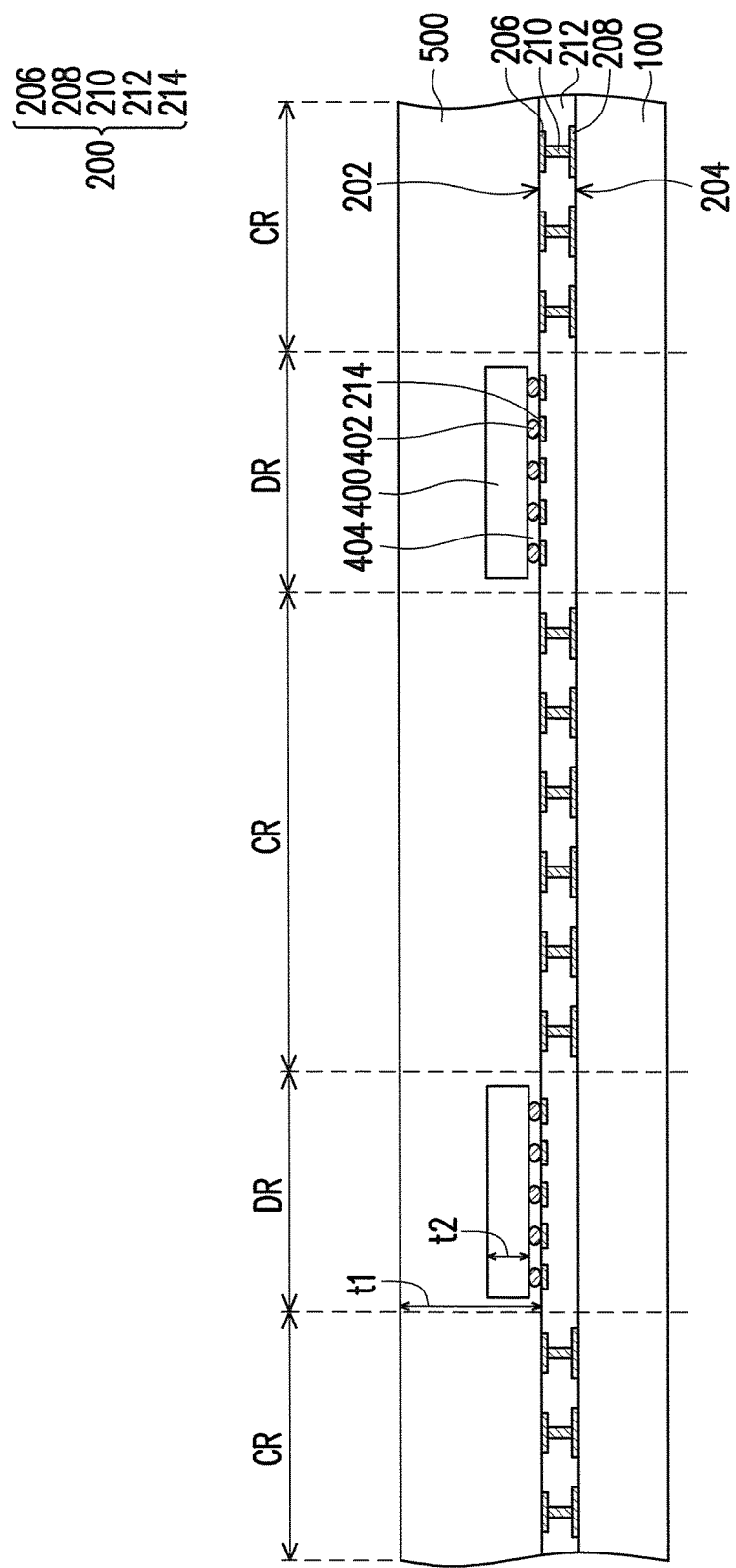
Figure 3D:
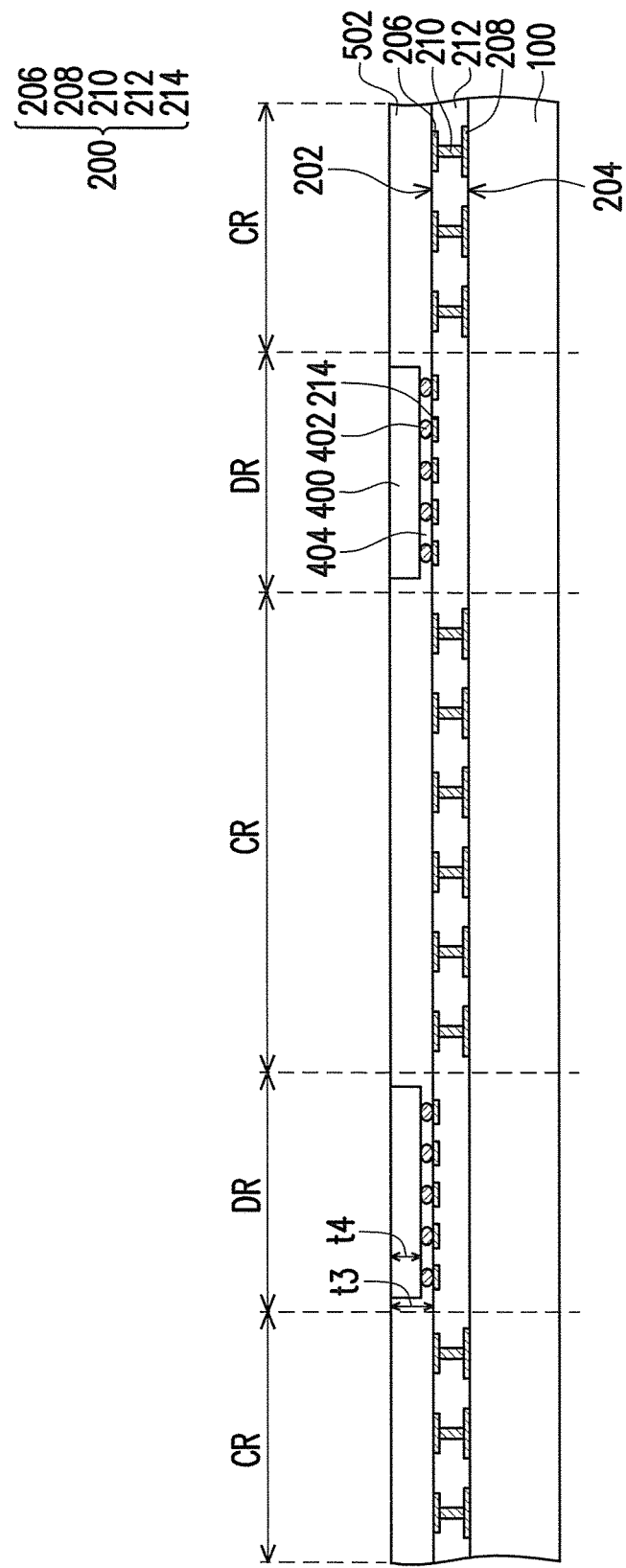
Figure 3E:
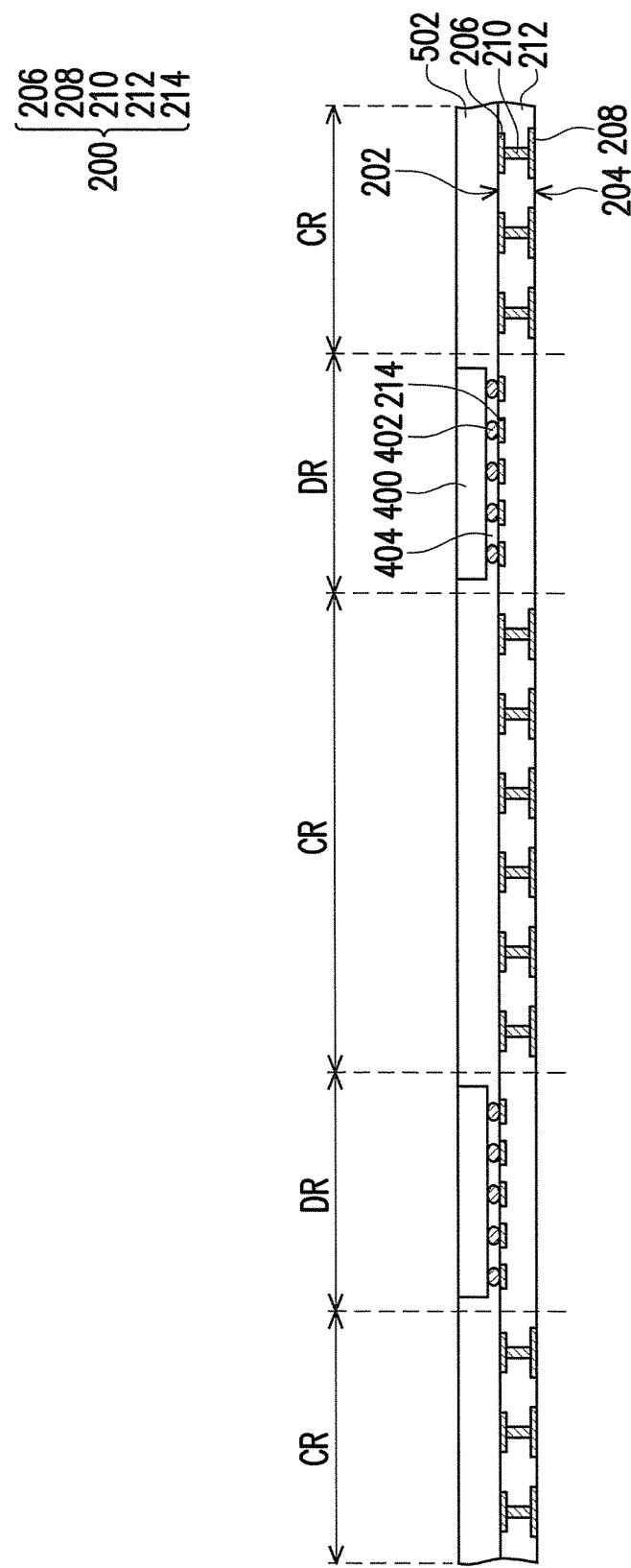
Figure 3F:
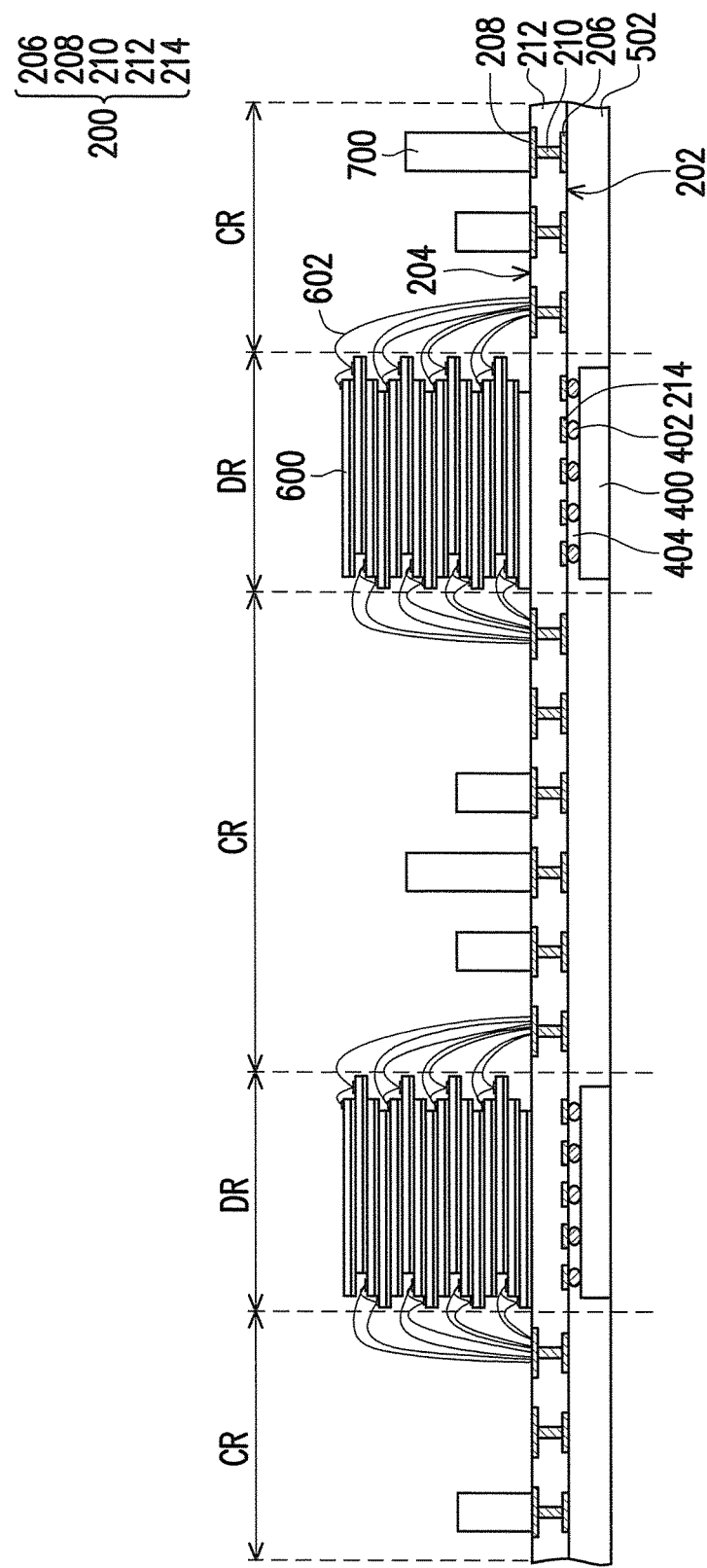
Figure 3G:
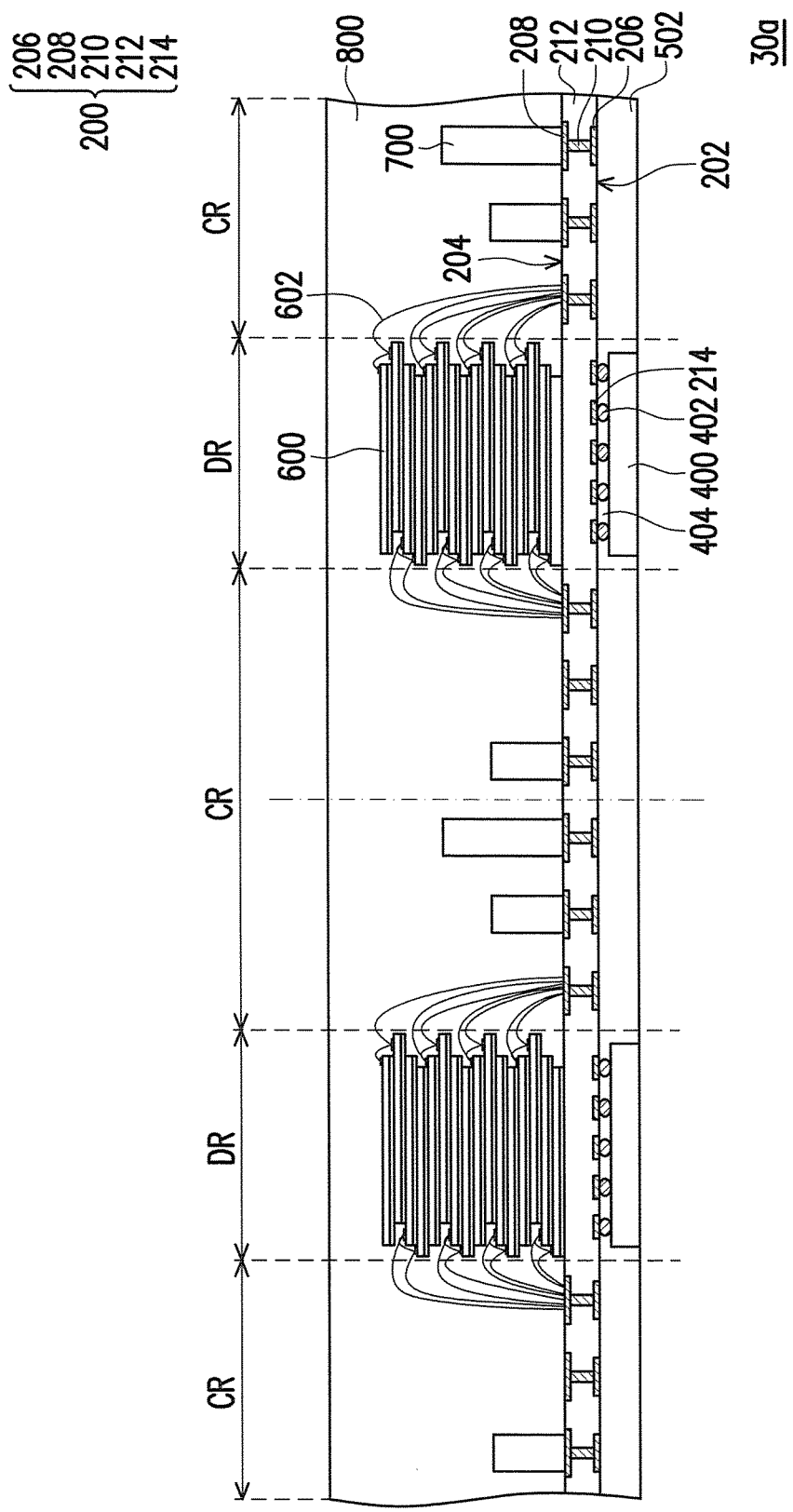

Referring to FIG. 3A, a redistribution layer (RDL) 200 is formed over a carrier 100. The RDL 200 and the carrier 100 are similar to the embodiment in FIG. 1A, so the detailed descriptions will be omitted herein. Referring to FIG. 3B to FIG. 3G, the processes are similar to the processes presented in FIG. 1C to FIG. 1H except the formation of the conductive terminals 300a (illustrated in FIG. 1B) and the formation of the solder balls 900a (illustrated in FIG. 1H) are omitted. In other words, referring to FIG. 3C, the encapsulating material 500 is only formed over the first dies 400. Referring to FIG. 3G, similar to the package structure array 10a in FIG. 1H, the singulation process is also performed on the package structure array 30a of the present embodiment.

Figure 3H:
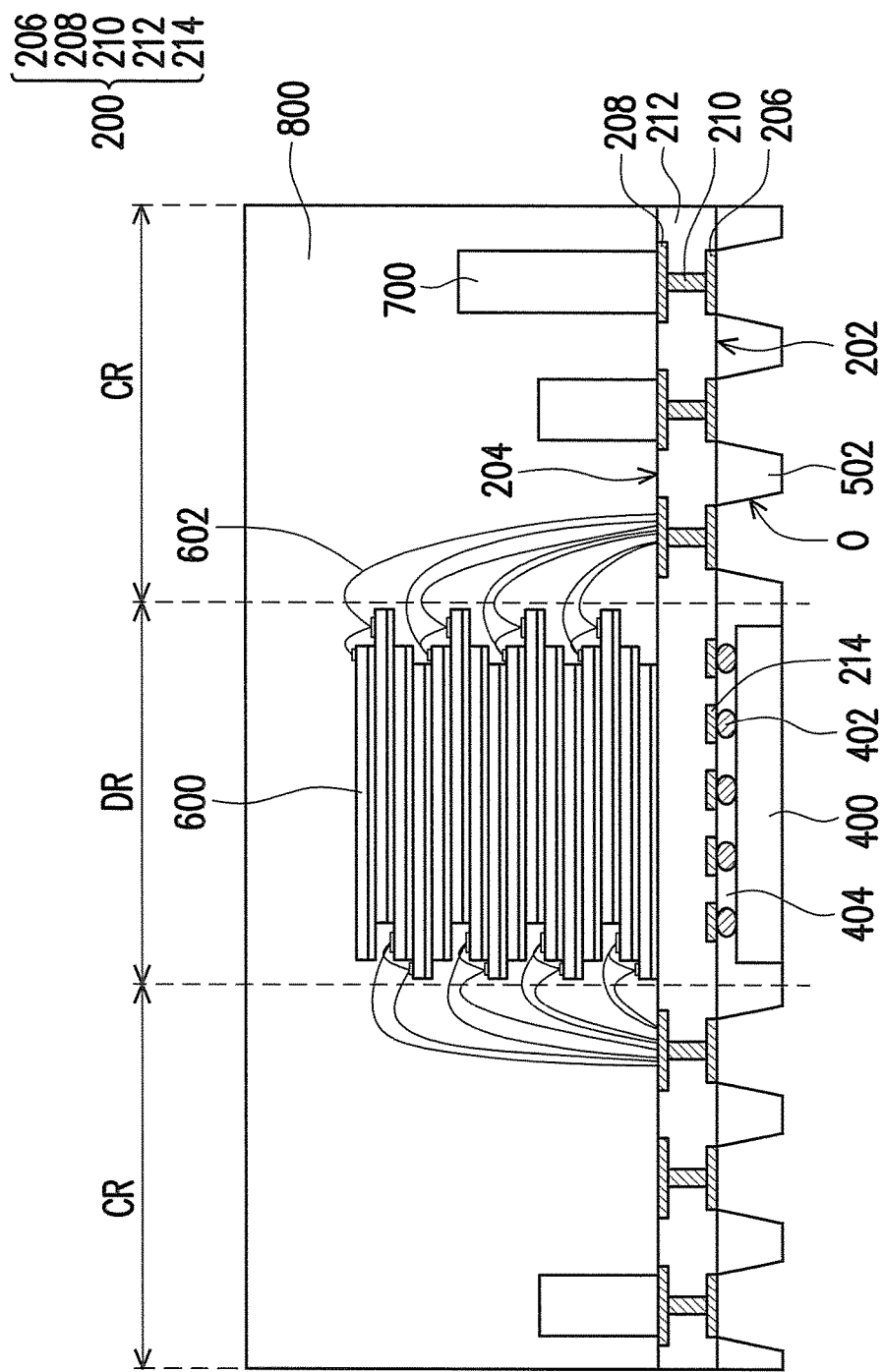

Subsequently, referring to FIG. 3H, a plurality of openings O are formed in the first encapsulant 502. In detail, the openings O are formed corresponding to the first metallic layer 206. The openings O may be formed through a drilling process. For example, a laser drilling or a mechanical drilling process may be performed on the first encapsulant 502 to generate the openings O. Since the openings O correspond to the first metallic layer 206, the openings O are located in the contact regions CR.

Figure 3I:
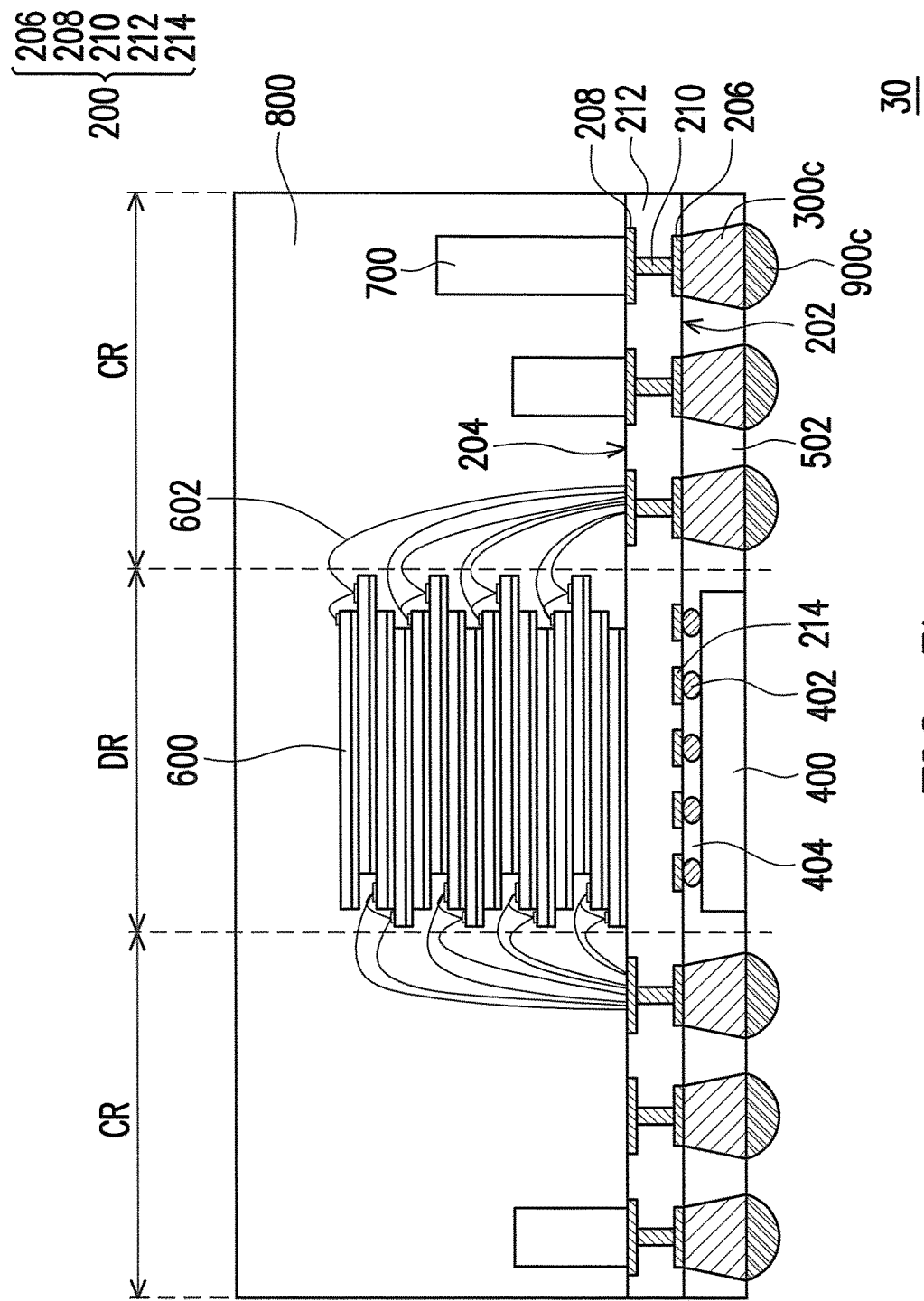

Referring to FIG. 3I, a conductive material is filled into the openings O, so as to form the conductive terminals 300C on the first surface 202 of the RDL 200. Since the conductive terminals 300C in the present embodiment are formed by filling the conductive material into the openings O, the conductive terminals 300C may be referred as through molding vias. Furthermore, in the present embodiment, solder balls 900c are formed over the conductive terminals 300c to enhance electrical connection with other package structures. The solder balls 900c are formed over the conductive terminals 300c exposed by the first encapsulant 502 through a ball placement process.

Referring FIG. 3I, the first die 400 and the second dies 600 are respectively formed on the first surface 202 and the second surface 204 of the RDL 200. Therefore, a substrate having a large thickness may be eliminated in the package structure 30. Moreover, since the first die 400 is disposed in a flip-chip manner, the first die 400 may be grinded to any desired thickness. Furthermore, as illustrated in FIG. 3I, the first die 400 is coplanar with the conductive terminals 300c. As such, a thickness of the package structure 30 may be effectively reduced, so as to achieve miniaturization in the package structure 30.

Based on the foregoing, the dies are formed on both sides of the RDL in the package structure of the invention. Therefore, a substrate having a large thickness may be eliminated in the package structure of the invention. Moreover, since at least one die is located on a surface opposite to the rest of the dies in a flip-chip manner, the at least one die may be grinded to any thickness. Furthermore, the at least one die may be coplanar with the conductive terminals. As a result, a thickness of the package structure may be reduced, thereby achieving miniaturization in the package structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
    a redistribution layer (RDL) having a first surface and a second surface opposite to the first surface;
    at least one first die and a plurality of conductive terminals electrically connected to the RDL, wherein the first die and the conductive terminals are located on the first surface of the RDL;
    a first encapsulant encapsulating the first die and the conductive terminals, wherein the first encapsulant exposes at least part of the conductive terminals;
    a plurality of solder balls electrically connected to the conductive terminals, wherein the solder balls are located over the conductive terminals exposed by the first encapsulant;
    a plurality of second dies electrically connected to the RDL and located on the second surface of the RDL; and
    a second encapsulant encapsulating the second dies.

2. The package structure according to claim 1, further comprising a plurality of passive components located on the second surface of the RDL.

3. The package structure according to claim 2, wherein the passive components are disposed corresponding to the conductive terminals.

4. The package structure according to claim 2, wherein the passive components comprises capacitors, resistors, inductors, fuses, or antennas.

5. The package structure according to claim 1, wherein the second dies are stacked with each other.

6. The package structure according to claim 1, wherein the conductive terminals surround the first die.

7. The package structure according to claim 1, wherein the first die is electrically connected to the RDL in a flip-chip manner.

8. The package structure according to claim 1, wherein the RDL has a thickness of 10 μm to 100 μm.

9. A manufacturing method of a package structure, comprising:
    forming a redistribution layer (RDL) over a carrier, wherein the RDL has a first surface and a second surface opposite to the first surface, the second surface of the RDL faces the carrier;
    forming a plurality of conductive terminals on the first surface of the RDL;
    forming at least one first die on the first surface of the RDL;
    encapsulating the first die by a first encapsulant;
    encapsulating the conductive terminals by the first encapsulant, wherein the first encapsulant exposes at least part of the conductive terminals;
    separating the second surface of the RDL from the carrier;
    forming a plurality of second dies on the second surface of the RDL;
    encapsulating the second dies by a second encapsulant; and
    forming a plurality of solder balls over the conductive terminals exposed by the first encapsulant.

10. The manufacturing method of a package structure according to claim 9, further comprising:
    forming a plurality of passive components on the second surface of the RDL.

11. The manufacturing method of a package structure according to claim 9, wherein the step of encapsulating the first die and the step of encapsulating the conductive terminals are performed simultaneously.

12. The manufacturing method of a package structure according to claim 11, wherein the step of encapsulating the first die and the step of encapsulating the conductive terminals comprises:
  forming an encapsulating material over the first die and the conductive terminals; and
  reducing a thickness of the encapsulating material and a thickness of the first die, so as to expose the at least part of the conductive terminals.

13. The manufacturing method of package structure according to claim 9, wherein the conductive terminals comprise conductive bumps.

14. The manufacturing method of a package structure according to claim 13, wherein the step of forming the conductive terminals comprises:
  performing a ball placement process, so as to form the conductive bumps.

15. The manufacturing method of package structure according to claim 9, wherein the conductive terminals comprise conductive pillars.

16. The manufacturing method of a package structure according to claim 15, wherein the step of forming the conductive terminals comprises:
  forming a seed layer over the RDL;
  covering at least part of the seed layer by a photoresist;
  forming a conductive material on the seed layer exposed by the photoresist;
  removing the photoresist; and
  removing the seed layer exposed by the conductive material, so as to form the conductive pillars.

17. The manufacturing method of a package structure according to claim 9, wherein the step of encapsulating the first die precedes the step of forming the conductive terminals.

18. The manufacturing method of a package structure according to claim 17, wherein the step of encapsulating the first die comprises:
  forming a encapsulating material over the first die; and
  reducing a thickness of the encapsulating material and a thickness of the first die.

19. The manufacturing method of a package structure according to claim 9, wherein the conductive terminals comprise through molding vias (TMV).

20. The manufacturing method of a package structure according to claim 19, wherein the step of forming the conductive terminals and the step of encapsulating the conductive terminals comprises:
  forming a plurality of openings in the first encapsulant, so as to expose the RDL; and
  forming the conductive terminals in the openings.

* * * * *